US011258970B2

(12) United States Patent
Yanagida et al.

(10) Patent No.: US 11,258,970 B2
(45) Date of Patent: Feb. 22, 2022

(54) IMAGING DEVICE

(71) Applicant: Panasonic Intellectual Property Management Co., Ltd., Osaka (JP)

(72) Inventors: Masaaki Yanagida, Kyoto (JP); Kazuko Nishimura, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/950,962

(22) Filed: Nov. 18, 2020

(65) Prior Publication Data

US 2021/0075984 A1    Mar. 11, 2021

Related U.S. Application Data

(63) Continuation of application No. PCT/JP2019/023180, filed on Jun. 12, 2019.

(30) Foreign Application Priority Data

Oct. 19, 2018  (JP) .............................. JP2018-197088

(51) Int. Cl.
| H04N 5/369 | (2011.01) |
| H04N 5/374 | (2011.01) |
| H04N 5/378 | (2011.01) |
| H03F 1/32  | (2006.01) |
| H03F 1/34  | (2006.01) |

(Continued)

(52) U.S. Cl.
CPC ......... *H04N 5/3698* (2013.01); *H04N 5/3745* (2013.01); *H01L 27/14665* (2013.01)

(58) Field of Classification Search
CPC .... H04N 5/3692; H04N 5/3745; H04N 5/378; H04N 3/1568; H04N 5/3698;

(Continued)

(56) References Cited

U.S. PATENT DOCUMENTS 11,140,351 B2 * 10/2021 Totsuka ................. H04N 5/378
2003/0034434 A1    2/2003 Simony
(Continued)

FOREIGN PATENT DOCUMENTS

| JP | 2002-510944 | 4/2002 |
| JP | 2008-301378 | 12/2008 |

(Continued)

OTHER PUBLICATIONS

International Search Report of PCT application No. PCT/JP2019/023180 dated Aug. 27, 2019.

*Primary Examiner* — Marly S Camargo

(74) *Attorney, Agent, or Firm* — McDermott Will & Emery LLP

(57) ABSTRACT

In an imaging device, each of first and second pixels in a same column includes a photoelectric converter, a first transistor, and a second transistor wherein a source (or a drain) of the first transistor is connected to the photoelectric converter, a gate of the second transistor is connected to the photoelectric converter, and a source (or a drain) of the second transistor is connected to the drain (or the source) of the first transistor. A first current source is configured to be electrically connected to the source (or the drain) of the second transistor of the first pixel, a second current source is configured to be electrically connected to the source (or the drain) of the second transistor of the second pixel, and a signal line is configured to be electrically connected to the drain (or the source) of the second transistor of the first pixel and to the drain (or the source) of the second transistor of the second pixel.

18 Claims, 18 Drawing Sheets

(51) Int. Cl.
*H01L 27/146* (2006.01)
*H04N 5/3745* (2011.01)

(58) Field of Classification Search
CPC ........ H03F 1/3205; H03F 1/342; H03F 1/483; H03F 2200/15; H03F 2200/474; H01L 27/14665; H01L 27/307
USPC ............... 348/308, 302, 301, 300, 294, 297; 257/291, 292, 293, 443; 250/208.1; 341/135
See application file for complete search history.

(56) References Cited

U.S. PATENT DOCUMENTS

| | | | |
|---|---|---|---|
| 2008/0303929 A1 | 12/2008 | Morimoto et al. | |
| 2011/0050967 A1* | 5/2011 | Matsumoto | H04N 5/3745 348/294 |
| 2013/0107093 A1* | 5/2013 | Aoki | H04N 5/335 348/302 |
| 2015/0187335 A1* | 7/2015 | Sugiyama | H09G 5/00 345/208 |
| 2017/0013221 A1* | 1/2017 | Yanagida | H04N 5/3745 |
| 2017/0214872 A1* | 7/2017 | Yanagida | H04N 5/363 |
| 2018/0007297 A1* | 1/2018 | Saito | H04N 5/378 |
| 2018/0352181 A1* | 12/2018 | Nishikawa | H04N 5/363 |
| 2021/0266485 A1* | 8/2021 | Kobayashi | H04N 5/378 |

FOREIGN PATENT DOCUMENTS

| | | |
|---|---|---|
| JP | 2016-127593 | 7/2016 |
| JP | 2017-175588 | 9/2017 |
| JP | 2018-007000 | 1/2018 |
| WO | 1999/052273 | 10/1999 |

* cited by examiner

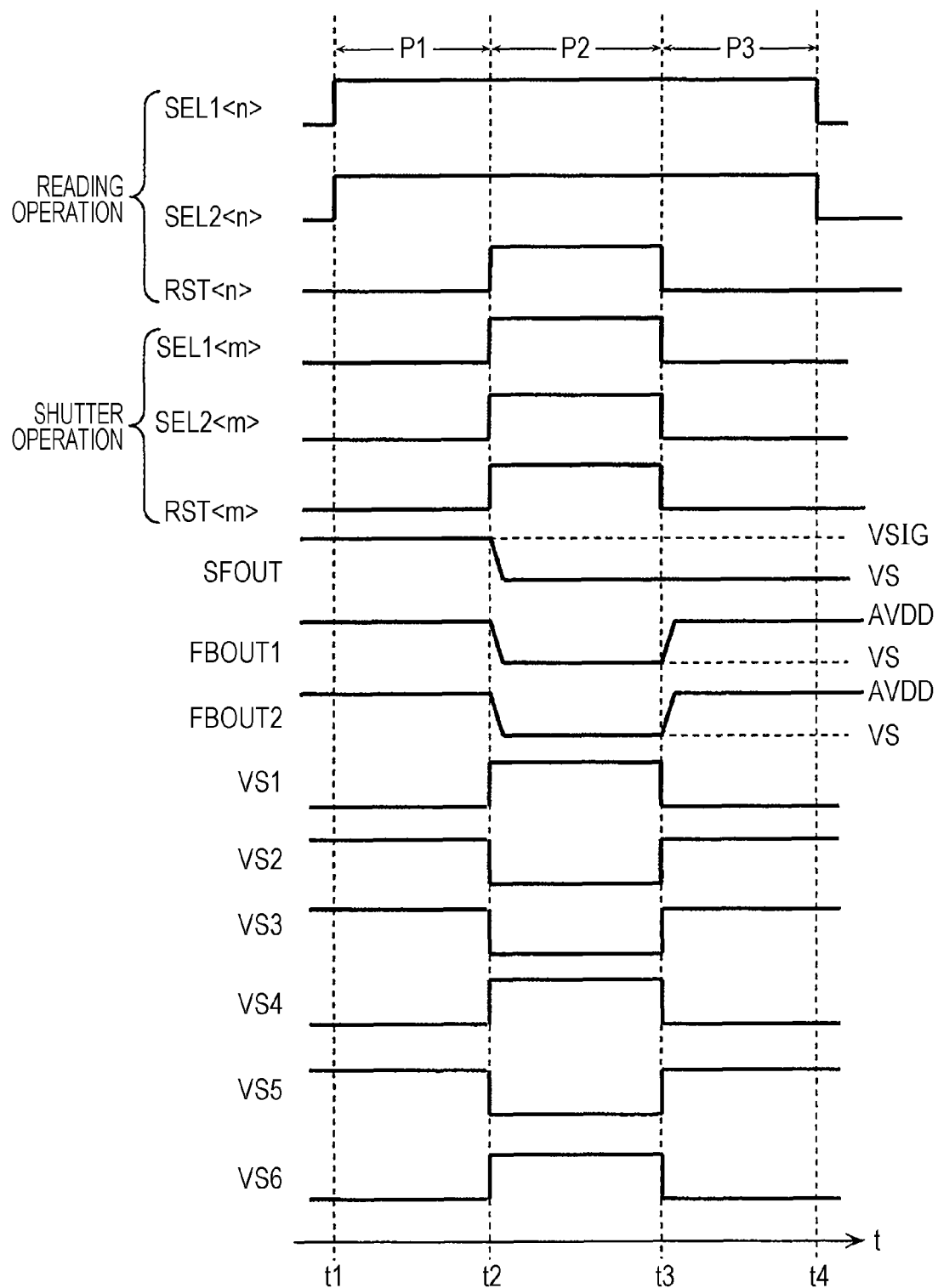

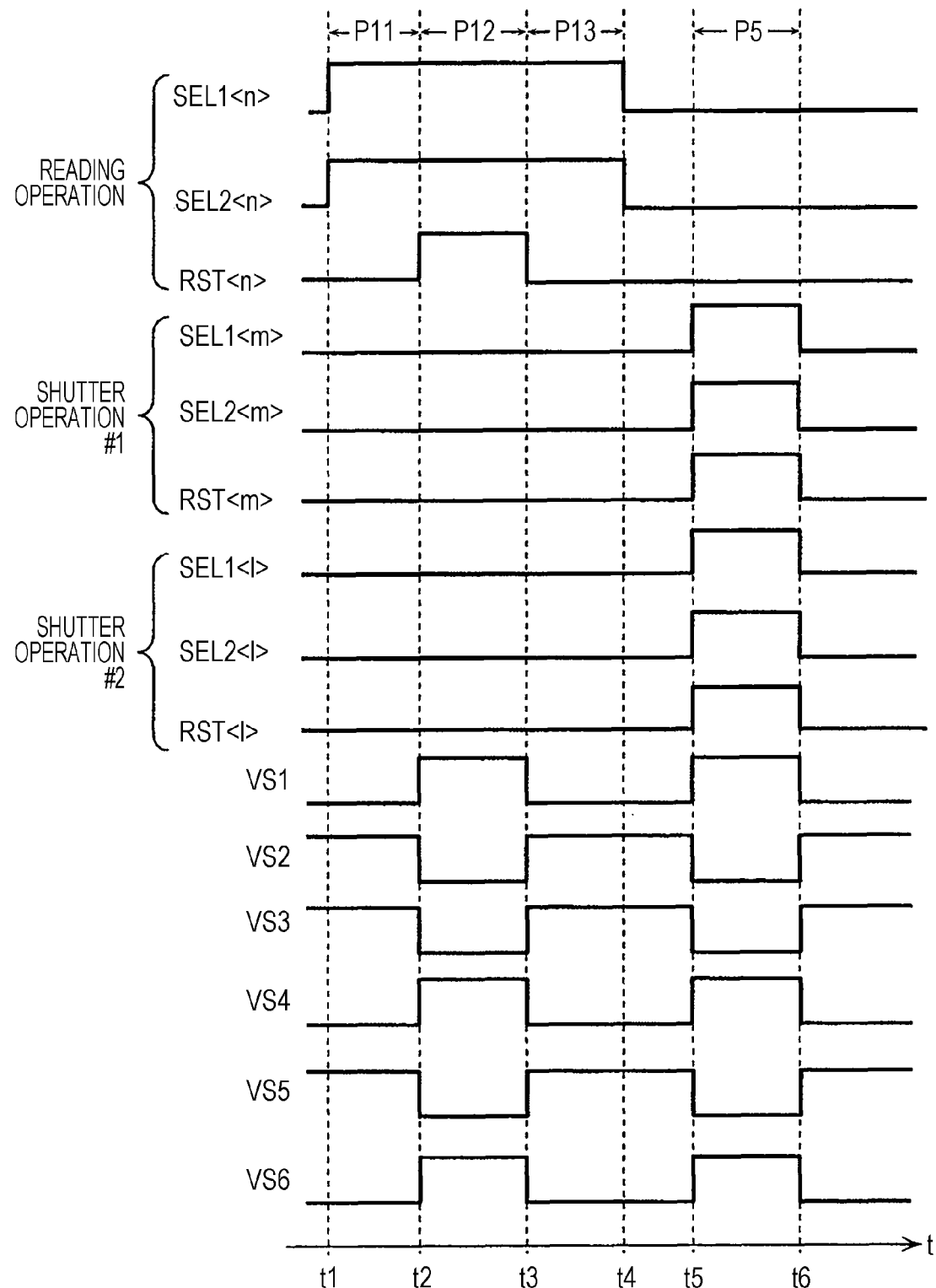

IMAGING DEVICE

BACKGROUND

1. Technical Field

The present disclosure relates to an imaging device that captures an image.

2. Description of the Related Art

In the related art, an imaging device is known that captures an image (see, for example, U.S. Pat. No. 6,664, 530).

SUMMARY

In imaging devices, there is a need for a technique for increasing a frame rate in continuous imaging.

In one general aspect, the techniques disclosed here feature an imaging device including pixels that are arranged in the form of an array and that include first pixels and second pixels located in a same column of the array of the pixels, each first and second pixel including a photoelectric converter that converts incident light to an electric charge, a first transistor one of a source and a drain of which is connected to the photoelectric converter, and a second transistor, a gate of which is connected to the photoelectric converter, and one of a source and a drain of which is connected to the other one of the source and drain of the first transistor, a first current source configured to be electrically connected to one of the source and the drain of the second transistor of each of the first pixels, a second current source configured to be electrically connected to one of the source and the drain of the second transistor of each of the second pixels, and a signal line configured to be electrically connected to the other one of the source and the drain of the second transistor of each of the first pixels and to the other one of the source and the drain of the second transistor of each of the second pixels.

An imaging device capable of achieving a high frame rate in continuous imaging is provided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a timing chart illustrating a first operation according to the first embodiment;

FIG. 7 is a timing chart illustrating a second operation according to the first embodiment;

DETAILED DESCRIPTION

Figure 1:
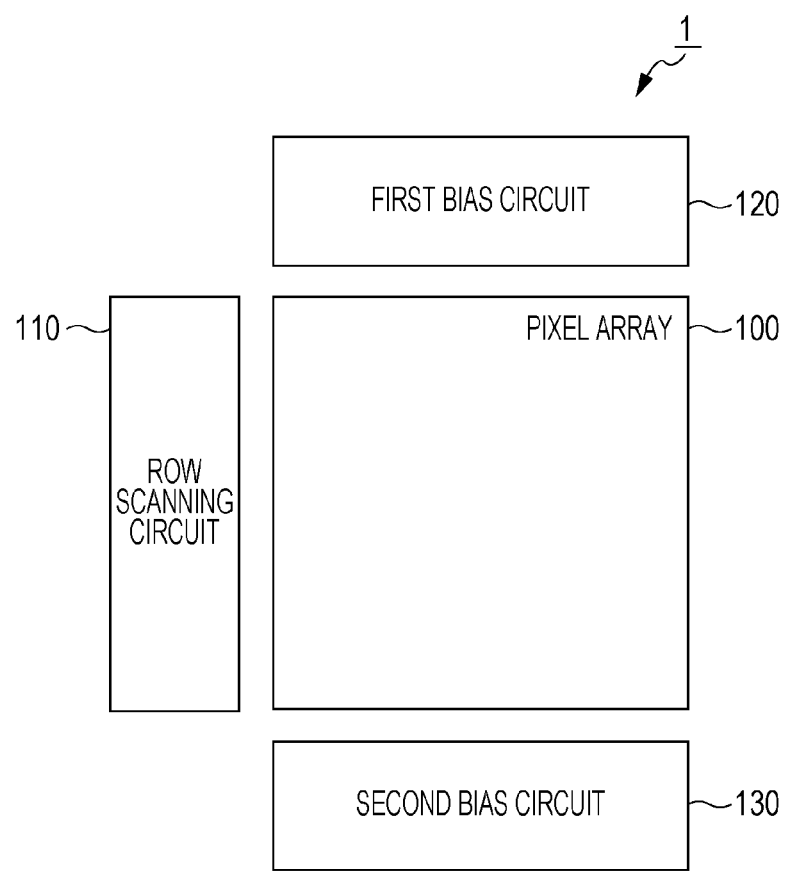
FIG. 1 is a block diagram schematically showing an imaging device according to a first embodiment.

According to an embodiment, the present disclosure provides an imaging device including pixels arranged in the form of an array, wherein the pixels include a first pixel and a second pixel located in the same column. The first pixel includes a first photoelectric converter that converts incident light to an electric charge, a first transistor including a first source, a first drain, and a first gate wherein one of the first source and the first drain is electrically connected to the first photoelectric converter, and a second transistor including a second source, a second drain, and a second gate wherein the second gate is electrically connected to the first photoelectric converter, and one of the second source and the second drain is electrically connected to the other one of the first source and the first drain. The second pixel includes a second photoelectric converter that converts incident light to an electric charge, a third transistor including a third source, a third drain, and a third gate wherein one of the third source and the third drain is electrically connected to the second photoelectric converter, and a fourth transistor including a fourth source, a fourth drain, and a fourth wherein the fourth gate is electrically connected to the second photoelectric converter, and one of the fourth source and the fourth drain is electrically connected to the other one of the third source and the third drain. The imaging device further includes a first current source electrically connected to the one of the second source and the second drains, a second current source electrically connected to the one of the fourth source and the fourth drains, and a third current source electrically connected to the other one of the second source and the second drain and the other one of the fourth source and the fourth drain.

According to the imaging device configured in the above-described manner, it is possible to execute independently resetting of the electric charge generated by the photoconversion by the first photoelectric converter in the first pixel and resetting of the electric charge generated by the photoelectric conversion by the second photoelectric converter in the second pixel. This makes it possible for the imaging device to achieve a high frame rate in continuous imaging.

The second transistor may be a transistor of a first conductivity type, the fourth transistor may a transistor of the first conductivity type, the first current source may include a first current source transistor of a second conductivity type different from the first conductivity type, the second current source may include a second current source transistor of the second conductivity type, and the third current source may include a third current source transistor of the first conductivity type.

As a result, a current flowing through the second transistor when the electric charge generated by the photoconversion by the first photoelectric converter in the first pixel is reset is in the same direction as the direction in which a current flows through the second transistor when the electric charge is read out. Furthermore, a current flowing through the fourth transistor when the electric charge generated by the photoconversion by the second photoelectric converter in the second pixel is reset is in the same direction as the direction in which a current flows through the fourth transistor when the electric charge is read out. Therefore, the imaging device configured in the above-described manner is capable of achieving high image quality in imaging.

The imaging device may further include a reference voltage source configured to be electrically connected to the other one of the second source and the second drain and to the other one of the fourth source and the fourth drain.

As a result, the reference voltage source can be used as an analog ground (GND) of the second transistor and the fourth transistor.

The imaging device may further include a first power supply configured to be electrically connected to the one of the second source and the second drain, and a second power supply configured to be electrically connected to the one of the fourth source and the fourth drain.

In this configuration, the first power supply can be used as a voltage supply source to the second transistor, and the second power supply can be used as a voltage supply source to the fourth transistor.

The imaging device may further include a fifth transistor configured to be electrically connected between the third current source and the other one of the second source and the second drain, and a sixth transistor configured to be electrically connected between the third current source and the other one of the fourth source and the fourth drain.

This makes it possible to switch the electrical connection state between the third current source and the other one of the second source and the second drain, and between the third current source and the other one of the fourth source and the fourth drain.

The imaging device may further include a seventh transistor electrically connected between the other one of the first source and the first drain and the one of the second source and the second drain.

This makes it possible to switch the electrical connection state between the other one of the first source and the first drain and the one of the second source and the second drain.

The imaging device may further include a first switch that switches between the conductive state and the non-conducting state and that is electrically connected between the source and the drain of the first current source transistor, and a second switch that switches between the conductive state and the non-conducting state and that is electrically connected between the source and the drain of the second current source transistor.

This makes it possible to switch between the conductive state and the non-conductive state for the electric connection between the source and the drain of the first current source transistor, and also to switch between the conductive state and the non-conductive state for the electric connection between the source and the drain of the second current source transistor.

According to another aspect, the present disclosure provides an imaging device including
a first pixel including a photoelectric converter that converts incident light to an electric charge and a transistor whose gate is connected to the photoelectric converter,
a first current source configured to be electrically connected to one of the source and the drain of the second transistor of each of the first pixels, and
a second current source configured to be electrically connected to the other one of the source and the drain of the second transistor of each of the first pixels.

The imaging device may further include
a first reference voltage source configured to be electrically connected to one of the source and the drain of the second transistor of each of the first pixels, and
a second reference voltage source configured to be electrically connected to the other one of the source and the drain of the second transistor of each of the first pixels.

The imaging device may further include
a first switching circuit that electrically connects one of the first current source and the reference voltage source to the one of the source and the drain of the second transistor, and
a second switching circuit that electrically connects one of the second current source and the second reference voltage source to the other one of the source and the drain of the second transistor.

Specific examples of the imaging device according to an aspect of the present disclosure are described below with reference to drawings. Note that each embodiment described below is for illustrating a specific example of the present disclosure. Therefore, in the following embodiments of the present disclosure, values, shapes, constituent elements, locations of elements, manners of connecting elements, steps, the order of steps, and the like are described by way of example but not limitation. Among constituent elements described in the following embodiments, those constituent elements that are not described in independent claims are optional. Note that each drawing is a schematic diagram, which does not necessarily provide a strict description. Constituent elements similar among embodiments are denoted by similar reference symbols, and a duplicated explanation thereof may be omitted.

Note that in the present specification, when it is described that an element is "connected" to another element, a third element may exist between these elements. When it is described that an element is "directly connected" to another element, there is no third element between these elements. Also note that when it is described that an element is "electrically connected" to another element, it is not necessary that these elements are always electrically connected, but these elements may be electrically connected at least at a certain point of time.

First Embodiment

An imaging device according to a first embodiment is described below with reference to drawings.

FIG. 1 is a block diagram schematically showing a configuration of an imaging device 1.

As shown in FIG. 1, the imaging device 1 includes a pixel array 100, a row scanning circuit 110, a first bias circuit 120, and a second bias circuit 130.

The pixel array 100 includes pixels arranged in the form of a matrix. As for a configuration of a pixel, a description will be given later with reference to FIG. 2.

The row scanning circuit 110 controls an operation of each pixel of the pixel array 100 on a row-by-row basis via signal lines (not shown) provided in common for respective rows.

The first bias circuit 120 supplies a voltage and a current to each pixel of the pixel array 100 via signal lines (not shown) provided in common for respective columns.

The second bias circuit 130 operates in synchronization with the row scanning circuit 110 such that via signal lines (not shown) provided in common for respective columns, electric charges accumulated in pixels located in a row are read out on a row-by-row basis under the control of the row scanning circuit 110.

In the following description, for simplicity, it is assumed by way of example but not limitation that the first bias circuit 120 is located, in plan view, above the pixel array 100 and the second bias circuit 130 is located, in plan view, below the pixel array 100. Also note that the first bias circuit 120 and the second bias circuit 130 do not necessarily need to be disposed on the same substrate as the substrate of the pixel array 100. For example, the pixel array 100 may be disposed on a first substrate, and the first bias circuit 120 and the second bias circuit 130 may be disposed on a second substrate laminated on the first substrate.

Figure 2:
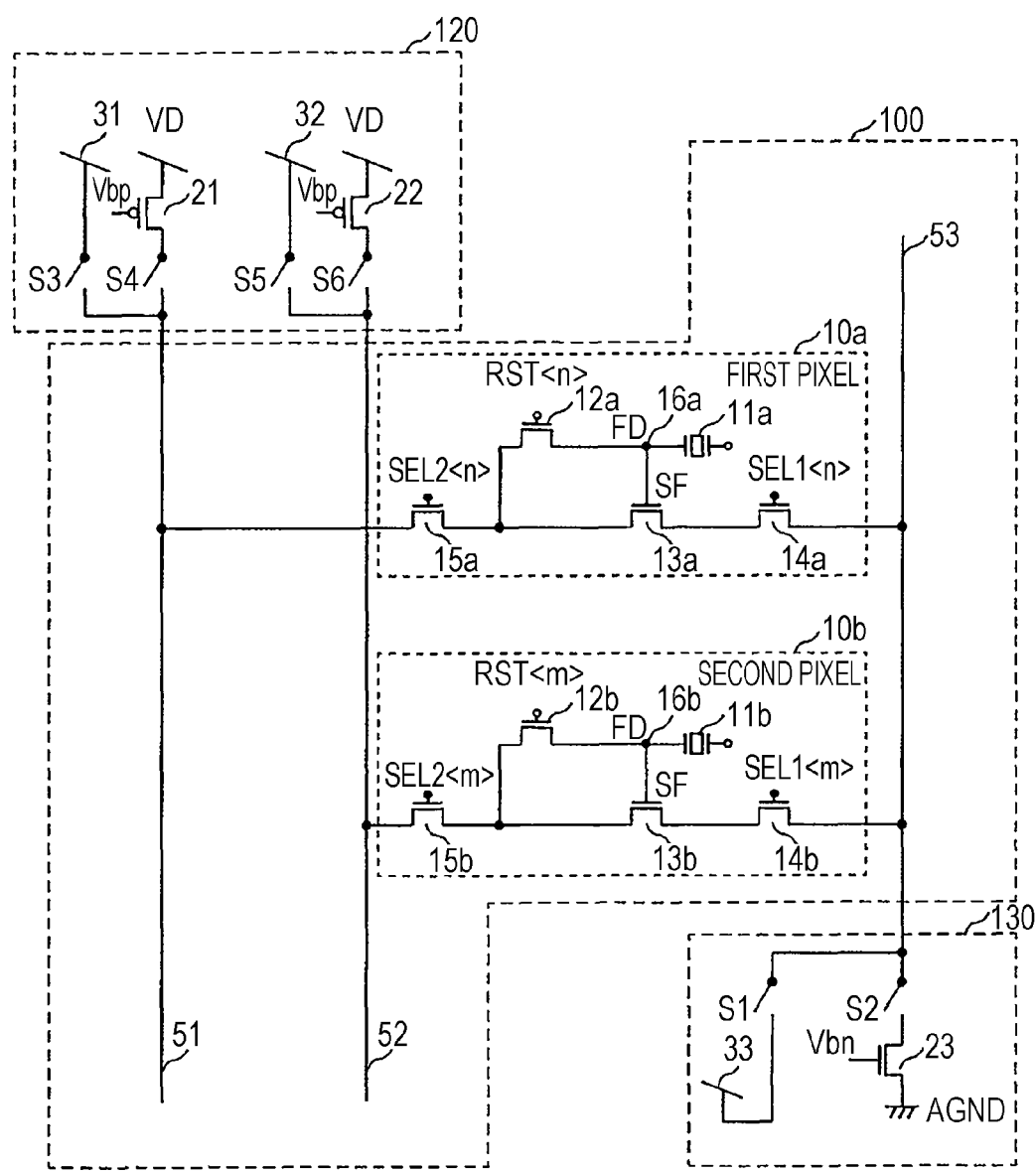
FIG. 2 is a block diagram showing main constituent elements of the imaging device according to the first embodiment.

FIG. 2 is a block diagram showing main constituent elements of the imaging device 1.

As shown in FIG. 2, the imaging device 1 includes a first pixel 10a, a second pixel 10b, a first current source 21, a second current source 22, a third current source 23, and a first power supply 31, a second power supply 32, a reference voltage source 33, a switch S1, a switch S2, a switch S3, a switch S4, a switch S5, a switch S6, a feedback signal line 51, a feedback signal line 52, and a vertical signal line 53. The reference voltage source 33 is a voltage source that supplies a reference voltage to an FD 16a and an FD 16b described later. The reference voltage is, for example, 1.0 V.

Of these constituent elements, the first pixel 10a and the second pixel 10b are included in the pixel array 100. The first current source 21, the second current source 22, the first power supply 31, the second power supply 32, the switch S3, the switch S4, the switch S5, and the switch S6 are included in the first bias circuit 120. The third current source 23, the reference voltage source 33, the switch S1, and the switch S2 are included in the second bias circuit 130.

The first pixel 10a is one of pixels included in the pixel array 100.

The second pixel 10b is one of the pixels included in the pixel array 100, and is located in the same row as the first pixel 10a.

Figure 16:
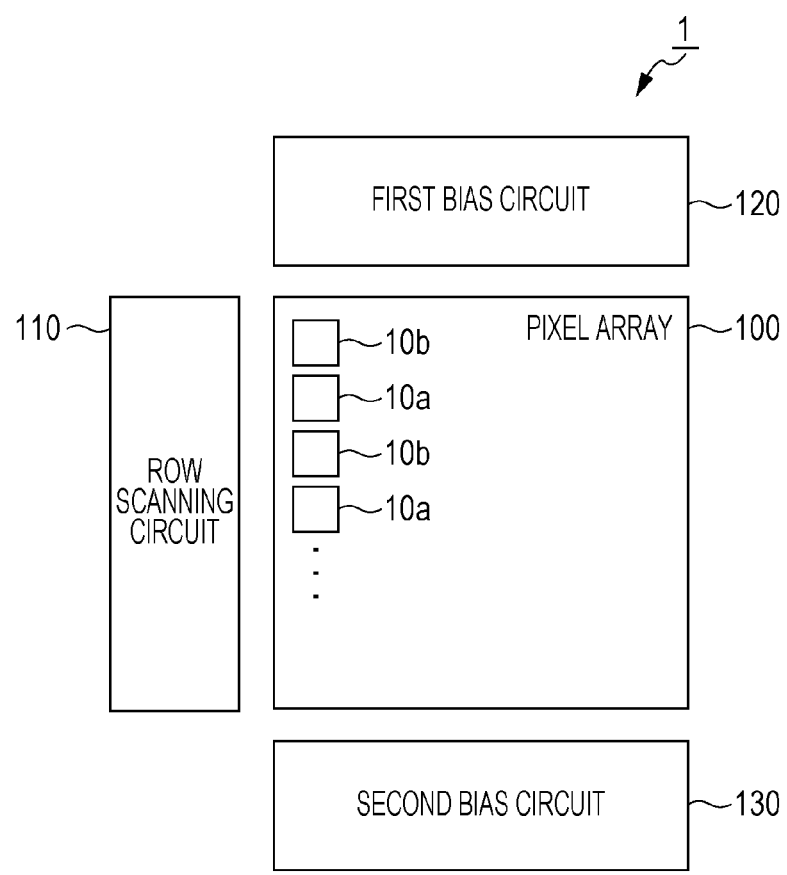
FIG. 16 is a block diagram illustrating an example of an imaging device according to the first embodiment.

In the following description, it is assumed, by way of example, that the first pixel 10a is located in an even-numbered row of the pixel array 100, and the second pixel 10b is located in an odd-numbered row of the pixel array 100. However, the arrangement is not limited to this example. It is also assumed, by way of example, that the pixels included in the pixel array 100 are either the first pixel 10a or the second pixel 10b. Note that pixels forming the pixel array 100 may include a pixel other than the first pixel 10a and the second pixel 10b. In the following description, it is assumed, by way of example, each even-numbered row of the pixel array 100 includes pixels corresponding to the first pixels 10a, and each odd-numbered row includes pixels corresponding to the second pixels 10b (see FIG. 16). However, the arrangement is not limited to this example.

As shown in FIG. 2, the first pixel 10a includes a first photoelectric converter 11a, a reset transistor 12a, an amplification transistor 13a, a first selection transistor 14a, a second selection transistor 15a, and an FD 16a.

The reset transistor 12a is an example of the first transistor of the first pixel according to the present disclosure. The amplification transistor 13a is an example of the second transistor of the first pixel according to the present disclosure. The first selection transistor 14a is an example of the third transistor of the first pixel according to the present disclosure.

The first photoelectric converter 11a converts incident light to an electric charge.

The reset transistor 12a is a transistor of the first conductivity type having a first source, a first drain, and a first gate, wherein one of the first source and the first drain is electrically connected to the first photoelectric converter 11a. In the present example, it is assumed by way of example that the first conductivity type is an n-type and the second conductivity type described later is a p-type. However, the first conductivity type and the second conductivity type do not necessarily need to be limited to the n-type and the p-type, respectively. For example, the first conductivity type and the second conductivity type may be the p-type and the n-type, respectively.

The amplification transistor 13a is a first-conductivity type transistor having a second source, a second drain, and a second gate, wherein the second gate is electrically connected to the first photoelectric converter 11a, and one of the second source and the second drain is electrically connected to the other one of the first source and the first drain.

The first selection transistor 14a is a first-conductivity type transistor, and is electrically connected between the third current source 23 and the other one of the second source and the second drain. The first selection transistor 14a is used to select the first pixel 10a connected to the vertical signal line 53.

The second selection transistor 15a is a first-conductivity type transistor, and is electrically connected between the first current source 21 and one of the second source and the second drain. The second selection transistor 15a is used to select, from among the first pixels 10a connected to the feedback signal line 51, a first pixel 10a whose amplification transistor 13a is to be operated as a common-source amplifier or a source follower.

The FD 16a is an electric charge accumulation region that accumulates the electric charge generated as a result of the photoelectric conversion by the first photoelectric converter 11a, and is electrically connected to the first photoelectric converter 11a, the second gate, and one of the first source and the first drain.

The second pixel 10b includes a second photoelectric converter 11b, a reset transistor 12b, an amplification transistor 13b, a first selection transistor 14b, a second selection transistor 15b, and an FD 16b.

The reset transistor 12b is an example of the first transistor of the second pixel according to the present disclosure. The amplification transistor 13b is an example of the second transistor of the second pixel according to the present disclosure. The first selection transistor 14b is an example of the third transistor of the second pixel according to the present disclosure.

The second photoelectric converter 11b converts incident light to an electric charge. The second photoelectric converter 11b is similar to the first photoelectric converter 11a. Therefore, in the following description, when it is not necessary to explicitly distinguish between the first photoelectric converter 11a and the second photoelectric converter 11b, the first photoelectric converter 11a and the second photoelectric converter 11b each may be generically referred to as a photoelectric converter 11.

The reset transistor 12b is a first-conductivity type transistor having a third source, a third drain, and a third gate, and one of the third source and the third drain is electrically connected to the second photoelectric converter 11b. The reset transistor 12b is similar to the reset transistor 12a.

The amplification transistor 13b is a first-conductivity type transistor having a fourth source, a fourth drain, and a fourth gate, wherein the fourth gate is electrically connected to the second photoelectric converter 11b, and one of the fourth source and the fourth drain is electrically connected to the other one of the third source and the third drain. The amplification transistor 13b is similar to the amplification transistor 13a.

The first selection transistor 14b is a first-conductivity type transistor, and is electrically connected between the third current source 23 and the other one of the fourth source and the fourth drain. The first selection transistor 14b is similar to the first selection transistor 14a.

The second selection transistor 15b is a first-conductivity type transistor, and is electrically connected between the second current source 22 and one of the fourth source and the fourth drain. The second selection transistor 15b is similar to the second selection transistor 15a.

The FD 16b is an electric charge accumulation region that accumulates electric charges generated as a result of the conversion by the second photoelectric converter 11b, and is electrically connected to the second photoelectric converter 11b, the fourth gate, and one of the third source and the third drain. The FD 16b is similar to the FD 16a. Therefore, in the following description, when it is not necessary to explicitly distinguish between the FD 16a and the FD 16b, the FD 16a and the FD 16b each may be generically referred to as an FD 16.

As described above, the first pixel 10a and the second pixel 10b are similarly configured except for external connections. Therefore, in the following description, when it is not necessary to explicitly distinguish between the first pixel 10a and the second pixel 10b, the first pixel 10a and the second pixel 10b each may be generically referred to as a pixel 10.

Figure 3:
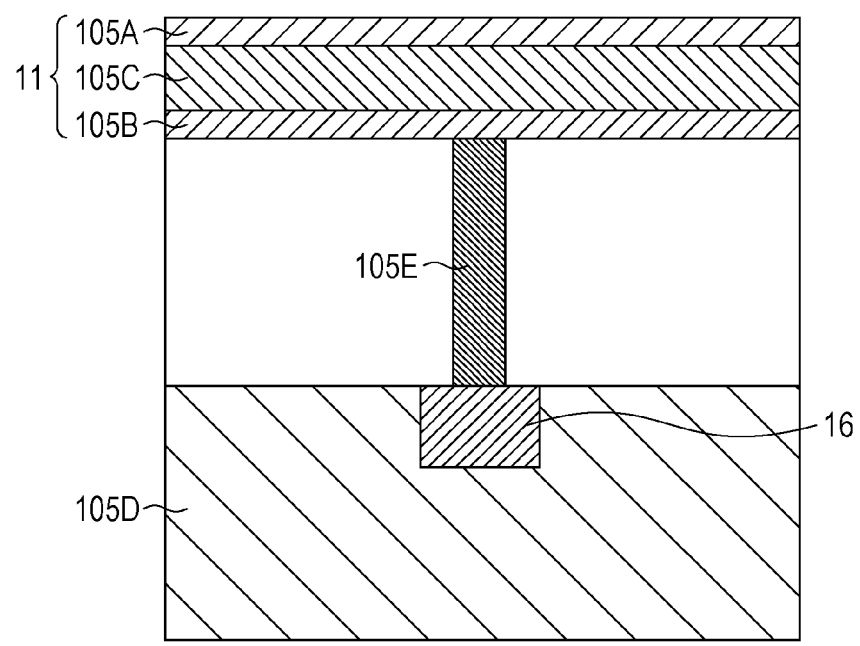
FIG. 3 is a cross-sectional view schematically showing structures of a photoelectric converter and an FD according to the first embodiment.

FIG. 3 is a cross-sectional view schematically showing structures of the photoelectric converter 11 and the FD 16.

As shown in FIG. 3, the photoelectric converter 11 includes a thin film photoelectric conversion layer 105C, a thin film transparent electrode 105A located above the photoelectric conversion layer 105C, and a thin film pixel electrode 105B located below the photoelectric conversion layer 105C. The pixel electrode 105B is connected to the FD 16 provided in a semiconductor substrate 105D via a contact plug 105E. The FD 16 is, for example, a diffusion layer containing an impurity.

The photoelectric conversion layer 105C generates electric charges due to a photoelectric effect by receiving light in a state where a bias voltage is applied between the transparent electrode 105A and the pixel electrode 105B. The converts incident light to the electric charges. Of the converted electric charges, one of the positive electric charge and the negative electric charge is collected by the pixel electrode 105B. The electric charge collected on the pixel electrode 105B is accumulated on the FD 16.

Referring again to FIG. 2, the configuration of the imaging device 1 is further described.

The switch S1 is a switch that switches between a conductive state and a non-conductive state according to a control signal VS1. The switch S2 is a switch that switches between a conductive state and a non-conductive state according to a control signal VS2. The switch S3 is a switch that switches between a conductive state and a non-conductive state according to a control signal VS3. The switch S4 is a switch that switches between a conductive state and a non-conductive state according to a control signal VS4. The switch S5 is a switch that switches between a conductive state and a non-conductive state according to a control signal VS5. The switch S6 is a switch that switches between a conductive state and a non-conductive state according to a control signal VS6.

The feedback signal line 51 is a signal line extending in a column direction in the pixel array 100, and is connected to the switch S3, the switch S4, and the second selection transistor 15a of each of the first pixels 10a located in the same column in the pixel array 100.

The feedback signal line 52 is a signal line extending in the column direction in the pixel array 100, and is connected to the switch S5, the switch S6, and the second selection transistor 15b of each of the second pixels 10b located in the same column as the column in which the first pixels 10a connected to the feedback signal line 51 are located.

The vertical signal line 53 is a signal line extending in the column direction in the pixel array 100, and is connected to the switch S1, the switch S2, the first selection transistor 14a of each of the first pixels 10a connected to the feedback signal line 51, and the first selection transistor 14b of each of the second pixels 10b connected to the feedback signal line 52.

The first current source 21 is a current source configured to be electrically connected to one of the second source and the second drain. More specifically, the first current source 21 is configured to be electrically connected to one of the second source and the second drain of the amplification transistor 13a via the switch S4, the feedback signal line 51, and the second selection transistor 15a. Here, it is assumed by way of example that the first current source 21 is realized using a second-conductivity type transistor. However, the transistor used to realize the first current source 21 is not limited to the second-conductivity type transistor as long as the function of the current source can be achieved.

The second current source 22 is a current source configured to be electrically connected to one of the fourth source and the fourth drain. More specifically, the second current source 22 is configured to be electrically connected to one of the fourth source and the fourth drain of the amplification transistor 13b via the switch S6, the feedback signal line 52, and the second selection transistor 15b. Here, it is assumed by way of example that the second current source 22 is realized using a second-conductivity type transistor. However, the transistor used to realize the second current source 22 is not limited to the second-conductivity type transistor as long as the function of the current source can be achieved.

The third current source 23 is a current source configure to be electrically connected to the other one of the second source and the second drain and the other one of the fourth source and the fourth drain. More specifically, the third current source 23 is configured to be electrically connected to the other one of the second source and the second drain of the amplification transistor 13a via the switch S2, the vertical signal line 53, and the first selection transistor 14a, and electrically connected to the other one of the second source and the second drain of the amplification transistor 13b via the switch S2, the vertical signal line 53, and the first selection transistor 14b. Here, it is assumed by way of example that the third current source 23 is realized using a first-conductivity type transistor. However, the transistor used to realize the third current source 23 is not limited to the first-conductivity type transistor as long as the function of the current source can be achieved.

The first power supply 31 is a power supply configured to be electrically connected to one of the second source and the second drain. More specifically, the first power supply 31 is configured to be electrically connected to one of the second source and the second drain of the amplification transistor 13a via the switch S3, the feedback signal line 51, and the second selection transistor 15a. The voltage of the first power supply 31 is higher than the voltage of the reference voltage source 33 described later. The first power supply supplies, for example, a power supply voltage. The power supply voltage is, for example, 3.3 V.

The second power supply 32 is a power supply configured to be electrically connected to one of the fourth source and the fourth drain. More specifically, the second power supply 32 is configured to be electrically connected to one of the fourth source and the fourth drain of the amplification transistor 13b via the switch S5, the feedback signal line 52, and the second selection transistor 15b. The voltage supplied by the second power supply 32 is higher than the voltage supplied by the reference voltage source 33 described later. The second power supply supplies, for example, a power supply voltage. The power supply voltage may be, for example, 3.3 V.

The reference voltage source 33 is a voltage source configure to be electrically connected to the other one of the second source and the second drain and the other one of the fourth source and the fourth drain. More specifically, the reference voltage source 33 is configured to be electrically connected to the other of the second source and the second drain of the amplification transistor 13a via the switch S1, the vertical signal line 53, and the first selection transistor 14a, and connected to the other of the fourth source and the fourth drain of the amplification transistor 13b via the switch S1, the vertical signal line 53, and the first selection transistor 14b. For example, the reference voltage source 33 supplies a voltage of 1.0 V as the reference voltage source.

The imaging device 1 configured in the above-described manner performs a first operation and a second operation. The first operation and the second operation performed by the imaging device 1 are described below with reference to drawings.

FIG. 4 is a timing chart associated with various signals in the first operation performed by the imaging device 1. This timing chart represents the first operation for a case where the first pixel 10a is located in an n-th (n is an integer equal to or greater than 1) line in the pixel array 100, and the second pixel 10b is located in an m-th (m is an integer equal to or greater than 1) line. For example, first pixels 10a may be located in odd-numbered rows and second pixels 10b may be located in even-numbered rows, alternately. In that case, n is odd and m is even.

In FIG. 4, a control signal SEL1<n> is a control signal for controlling the first pixel 10a located in the n-th row in the pixel array 100, and is applied to the gate of the first selection transistor 14a. A control signal SEL2<n> is a control signal for controlling the first pixel 10a located in the n-th row in the pixel array 100, and is applied to the gate of the second selection transistor 15a. A control RST<n> is a control signal for controlling the first pixels 10a, and is applied to the gate of the reset transistor 12a. A control signal SEL1<m> is a control signal for controlling the second pixel 10b located in the m-th row in the pixel array 100, and is applied to the gate of the first selection transistor 14a. A control signal SEL2<m> is a control signal for controlling the second pixel 10b located, and is applied to the gate of the second selection transistor 15b A control RST<m> is a control signal for controlling the second pixel 10b, and is applied to the gate of the reset transistor 12b.

These control signals are generated by the row scanning circuit 110 and are supplied to pixels 10 located in respective rows via signal lines provided in common for respective rows of the pixel array 100.

SFOUT is a signal transmitted via the vertical signal line 53. FBOUT1 is a signal transmitted via the feedback signal line 51. FBOUT2 is a signal transmitted via the feedback signal line 52.

VS is the voltage of the reference voltage source 33. AVDD is the voltage of the first power supply 31 and the second power supply 32.

In the first operation, as shown in FIG. 4, the control signal SEL1<n> and the control signal SEL2<n> are at a HIGH level for a period P1 from time t1 to time t2. As a result, the first pixel 10a is connected to the vertical signal line 53, and the first pixel 10a is connected to the feedback signal line 51. For this period P1, the control signal VS2 and the control signal VS3 are at the HIGH level, and thus the switch S2 and the switch S3 are in the conductive state. As a result, the first power supply 31 is connected to the feedback signal line 51, and the third current source 23 is connected to the vertical signal line 53. As a result, for the period P1, the amplification transistor 13a operates as a source follower circuit that allows a current to flow from one of the second source and the second drain to the other one. Therefore, the electric charge accumulated in the FD 16a is output as a signal voltage VSIG to the vertical signal line 53. That is, the electric charge accumulated in FD 16a is read out. In other words, the period P1 is a signal reading period in which the pixel signal is read out.

Figure 5A:
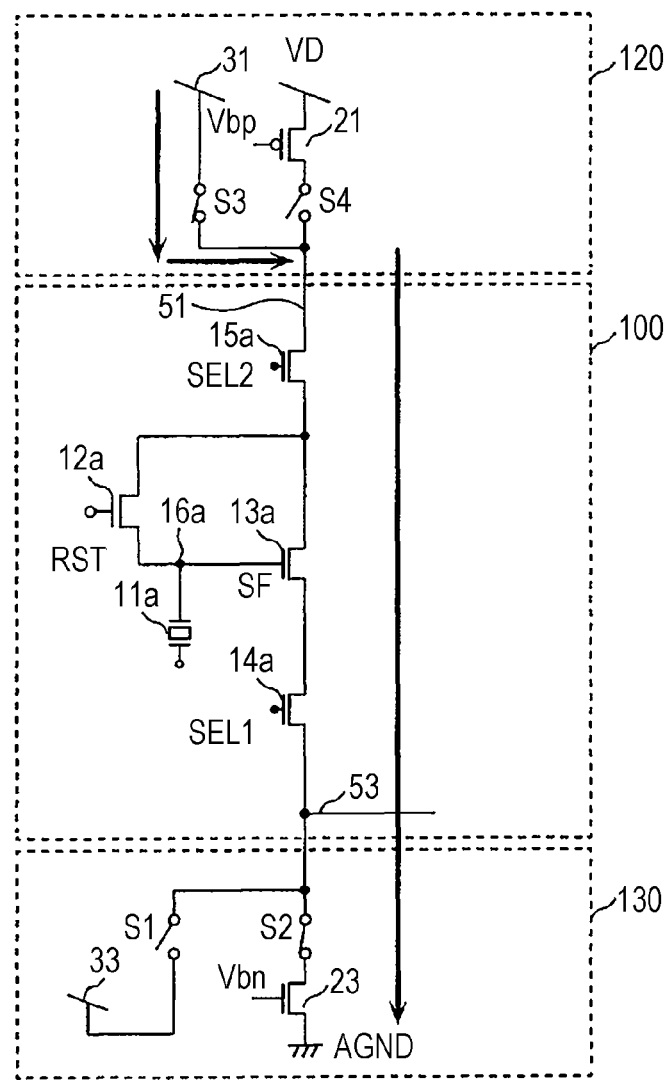
FIG. 5A is a schematic diagram illustrating a manner in which a current flows when an amplification transistor operates as a source follower circuit according to the first embodiment.

FIG. 5A is a schematic diagram illustrating a manner in which a current flows when the amplification transistor 13a operates as a source follower circuit for the period P1.

As described above, for the period P1, the amplification transistor 13a operates as the source follower circuit that allows a current to flow from one of the second source and the second drain to the other one. Therefore, as shown in FIG. 5A, when the amplification transistor 13a operates as the source follower circuit for the period P1, the current flows through the feedback signal line 51 in a direction from the first bias circuit 120 to the second bias circuit 130. More specifically, when the amplification transistor 13a operates as the source follower circuit, the current flows such that the current flows out from the first power supply 31 and the current flows through feedback signal line 51, the reset transistor 12a, the first selection transistor 14a, the vertical signal line 53, and the switch S1, and finally the current flows into the third current source 23.

Referring again to FIG. 4, the first operation is further described.

In the first operation, as shown in FIG. 4, the control signal SEL1<n>, the control signal SEL2<n>, the control signal SEL1<m>, and the control signal SEL2<m> are at the HIGH level for a period P2 from time t2 to time t3. As a result, the first pixel 10a and the second pixel 10b are connected to the vertical signal line 53, the first pixel 10a is connected to the feedback signal line 51, and the second pixel 10b is connected to the feedback signal line 52. For this period P2, the control signal VS1, the control signal VS4, and the control signal VS6 are at the HIGH level, and thus the switch S1, the switch S4, and the switch S6 are in the conductive state. As a result, the first current source 21 is connected to the feedback signal line 51, the second current source 22 is connected to the feedback signal line 52, and the reference voltage source 33 is connected to the vertical signal line 53. Also for this period P2, the control signal RST<n> and the control signal RST<m> are at the HIGH level. Therefore, for this period P2, the amplification transistor 13a operates as a common-source amplifier circuit that allows a current to flow from one of the second source and the second drain to the other, and the amplification transistor 13b operates as a common-source amplifier circuit that allows a current to flow from one of the fourth source and the fourth drain to the other one. As a result, the electric charge accumulated in the FD 16a is reset by the reference voltage source 33, and the electric charge accumulated in the FD 16b is reset by the reference voltage source 33. Note that the resetting of the electric charge accumulated in the FD 16a or the FD 16b by the reference voltage source 33 means that the voltage of the FD 16a or the FD 16b is set to the voltage of the reference voltage source 33.

Figure 5B:
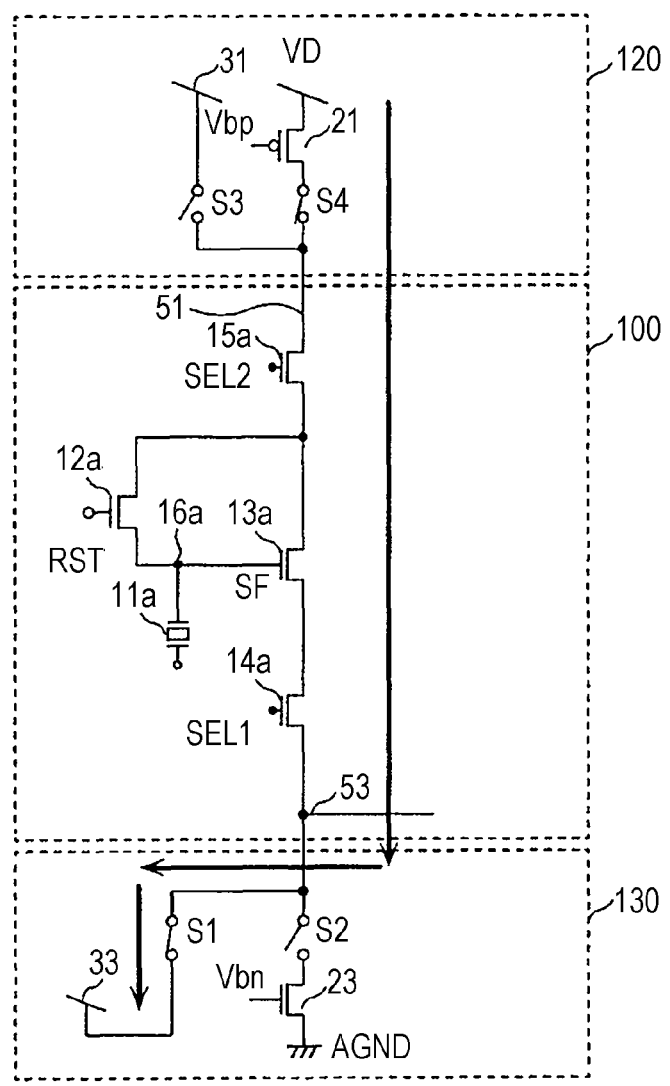
FIG. 5B is a schematic diagram illustrating a manner in which a current flows when an amplification transistor operates as a common-source amplifier circuit according to the first embodiment.

FIG. 5B is a schematic diagram illustrating a manner in which a current flows when the amplification transistor 13a operates as the common-source amplifier circuit for the period P2.

As described above, for the period P2, the amplification transistor 13a operates as the common-source amplifier circuit that allows a current to flow from one of the second source and the second drain to the other one. Therefore, as shown in FIG. 5B, when the amplification transistor 13a operates as the common-source amplifier circuit for the period P2, the current flows through the feedback signal line 51 in the direction from the first bias circuit 120 to the second bias circuit 130. Similarly, when the amplification transistor 13b operates as the common-source amplifier circuit for the period P2, the current flows through the feedback signal line 52 in the direction from the first bias circuit 120 to the second bias circuit 130. More specifically, when the amplification transistor 13a operates as the common-source amplifier circuit, the current flows such that the current flows out from the first current source 21 and the current flows through feedback signal line 51, the reset transistor 12a, the first selection transistor 14a, the vertical signal line 53, and the switch S1, and finally the current flows into the reference voltage source 33.

Referring again to FIG. 4, the first operation is further described.

In the first operation, as shown in FIG. 4, for a period P3 from time t3 and time t4, the control signal SEL1<n>, the control signal SEL2<n>, the control signal VS2, and the control signal VS3 are at the same level as the level for the P1. As a result, for the period P3, like the period P1, the amplification transistor 13a operates as the source follower circuit that allows a current to flow from the one of the second source and the second drain to the other one. Therefore, the electric charge accumulated in the FD 16a is output as a signal voltage VSIG to the vertical signal line 53. That is, the electric charge accumulated in FD 16a is read out.

As shown in FIG. 4, the period P3 is a period directly following the period P2. Therefore, for the period P3, the signal voltage VSIG output to the vertical signal line 53 has a voltage value corresponding to the electric charge accumulated in the FD 16a immediately after being reset. The signal voltage VSIG output for this period P3 is used in a correlated double sampling process performed to accurately calculate the electric charge accumulated in the FD 16a for an exposure period of the first pixel 10a. In other words, the period P3 is a reset signal reading period in which the reset signal is read out.

As described above, in the first operation, the imaging device 1 performs, for periods P1 to P3, the reading operation including a sequence of operations: reading the electric charge accumulated in the FD 16a of the first pixel 10a; resetting the electric charge accumulated in the FD 16a immediately after the reading; and reading the electric charge accumulated in the FD 16a immediately after the resetting. Furthermore, in the period P2, the imaging device 1 performs a shutter operation such that the electric charge accumulated in the FD 16b of the second pixel 10b in the m-th row is reset without reading out the electric charge. As described above, in the first operation, the imaging device 1 simultaneously executes the reading operation for the first pixel 10a and the shutter operation for the second pixel 10b.

In the imaging device 1, as described above with reference to FIG. 5A, when the amplification transistor 13a operates as the source follower, the current flows through the feedback signal line 51 in the direction from the first bias circuit 120 to the second bias circuit 130. Furthermore, in the imaging device 1, as described above with reference to FIG. 5B, when the amplification transistor 13a operates as the amplifier, the current flows through the feedback signal line 51 in the direction from the first bias circuit 120 to the second bias circuit 130. That is, in the imaging device 1, currents flow in the same direction in the feedback signal line 51 in both cases where the amplification transistor 13a operates as the source follower and where the amplification transistor 13a operates as the amplifier.

Figure 6A:
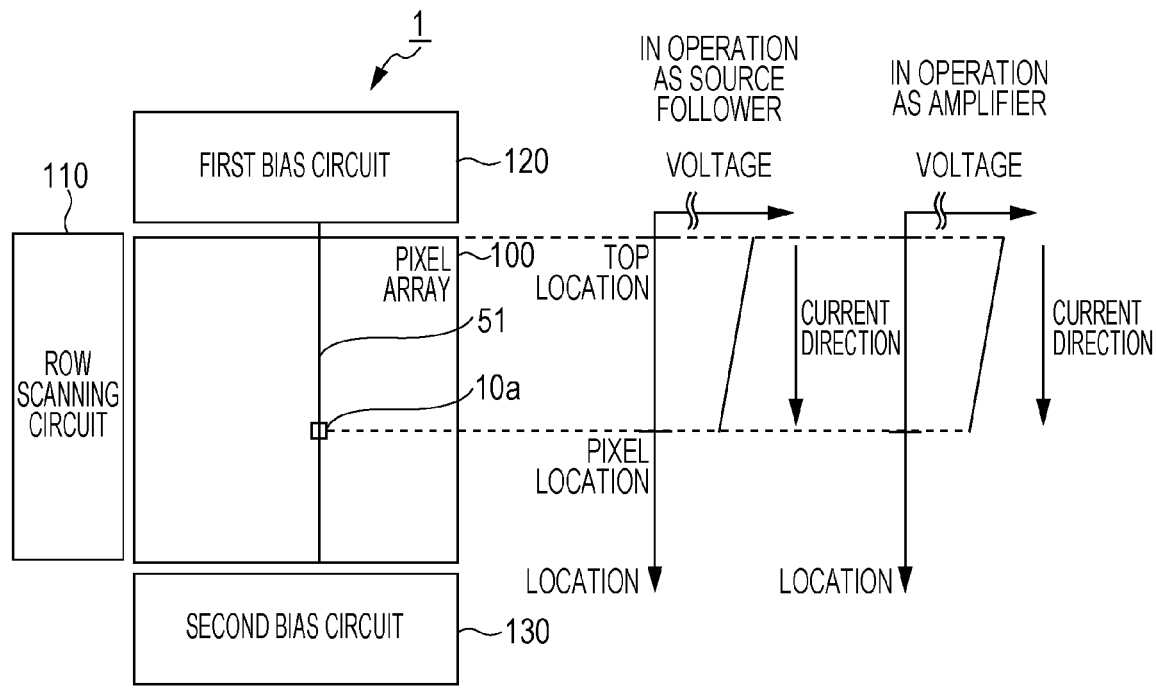
FIG. 6A is a schematic diagram illustrating a gradient of a voltage drop occurring along a feedback signal line according to the first embodiment.

FIG. 6A is a diagram schematically illustrating a gradient of a voltage drop along the feedback signal line 51 caused by a current flowing through the feedback signal line 51 for a case where the amplification transistor 13a of the first pixel 10a operates as the source follower and also for a case where the amplification transistor 13a operates as the amplifier in the imaging device 1.

Figure 6B:
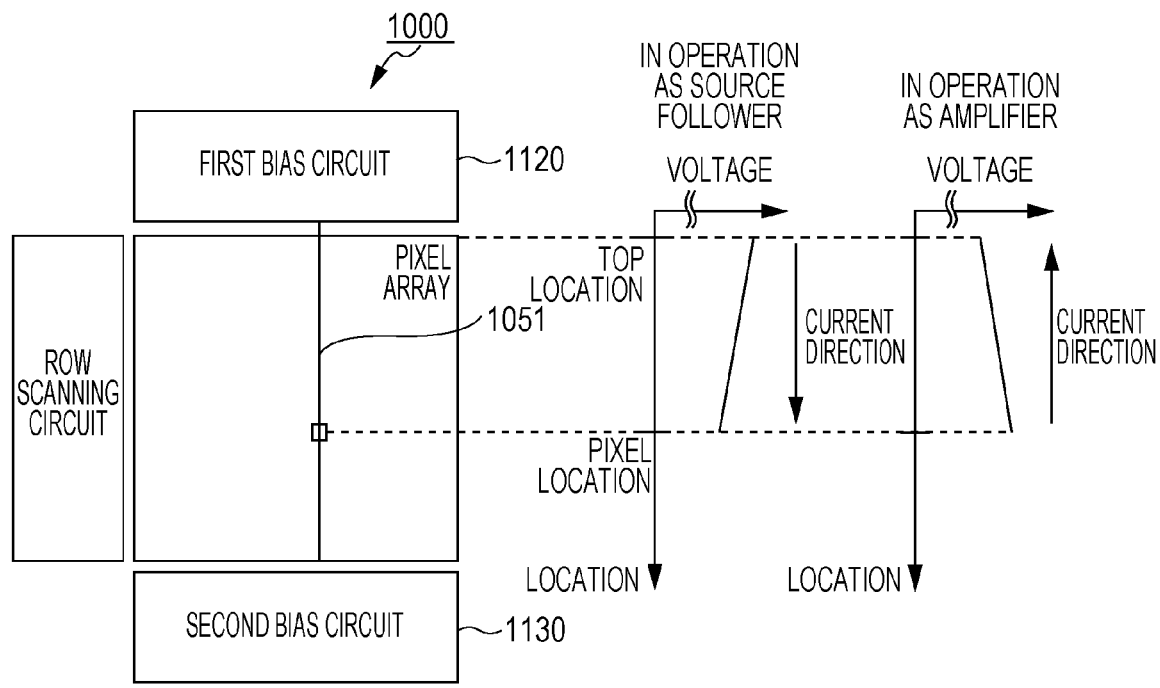
FIG. 6B is a schematic diagram illustrating a gradient of a voltage drop occurring along a signal line in a comparative example of an imaging device according to a conventional technique.

FIG. 6B is a diagram schematically illustrating a gradient of a voltage drop along a signal line 1051 caused by a current flowing through the signal line 1051 for a case where a transistor corresponding to the amplification transistor 13a according to the present disclosure operates as the source follower and also illustrate, for comparison, for a case where the transistor operates as an amplifier in an imaging device 1000 according to a comparative example of a technique. The signal line 1051 corresponds to the feedback signal line 51 in the present disclosure. The imaging device 1000 is an imaging device assumed to be configured so as to operate as follows. In the imaging device 1000, when the transistor corresponding to the amplification transistor 13a in the present disclosure operates as a source follower, a current flows through the signal line 1051 in a direction from a first bias circuit 1120 to a second bias circuit 1130. In the imaging device 1000, when the transistor corresponding to the amplification transistor 13a in the present disclosure operates as an amplifier, a current flows through the signal line 1051 in a direction from the second bias circuit 1130 to the first bias circuit 1120.

In the imaging device 1, as shown in FIG. 6A, the direction of the gradient of the voltage drop occurring along the feedback signal line 51 is the same for the case where the amplification transistor 13a operates as the source follower and for the case where the amplification transistor 13a operates as the amplifier. Therefore, in the imaging device 1, a difference in voltage on the feedback signal line 51 for the same pixel is small between the source follower operation and the amplifier operation of the amplification transistor 13a.

In contrast, in the imaging device 1000, as shown in FIG. 6B, the direction of the gradient of the voltage drop that occurs along the signal line 1051 is opposite between the source follower operation and the amplifier operation of the transistor corresponding to the amplification transistor 13a in the present disclosure. Therefore, in the imaging device 1000, a significant difference in voltage on the feedback signal line 51 for the same pixel can occur between the source follower operation and the amplifier operation of the transistor corresponding to the amplification transistor 13a.

As can be seen from these facts described above, the imaging device 1 can achieve higher accuracy, than the imaging device 1000 can, in the signal voltage VSIG that is output immediately after the electric charge accumulated in the FD 16a and that is used in the correlated double sampling process. Here, the resetting is a process performed by the amplification transistor 13a operating as the amplifier, and the outputting of the signal voltage VSIG performed immediately after the resetting is performed by the amplification transistor 13a operating as the source follower. Thus, the imaging device is capable of achieving high image quality in imaging compared to the imaging device 1000.

As described above, in the first pixel 10a located in the n-th row of the pixel array 100, the electric charge accumulated in the FD 16a can be reset by setting the signal levels to HIGH for the control signal SEL1<n>, the control signal SEL2<n>, the control signal VS1, and the control signal VS4. Similarly, in the second pixel 10b located in the m-th row, the electric charge accumulated in the FD 16b can be reset by setting the signal levels to HIGH for the control signal SEL1<m>, the control signal SEL2<m>, the control signal VS1, and the control signal VS6. Thus, the imaging device 1, it is possible to execute independently resetting of the electric charge accumulated in the first pixel 10a and the resetting of the electric charge accumulated in the second pixel 10b. Therefore, the imaging device 1 is capable of achieving a high frame rate in continuous imaging.

Note that in the first operation, the second pixel 10b may be a pixel located in the n-th row of the pixel array 100, and the first pixel 10a may be a pixel located in the m-th row of the pixel array 100. In this case, the control signal SEL1<n>, the control signal SEL2<n>, and the control signal RST<n> should be read as the control signals for the second pixel 10b, and the control signal SEL1<m> and the control signal SEL2<m>, and the control signal RST<m> should be read as the control signals for the first pixel 10a. That is, in this case, in the first operation, the imaging device 1 simultaneously executes the reading operation for the second pixel 10b and the shutter operation for the first pixel 10b.

FIG. 7 is a timing chart associated with various signals in the second operation performed by the imaging device 1. This timing chart represents the first operation for a case where a third pixel is located in an n-th row in the pixel array 100, the second pixel 10b is located in the m-th row, and the first pixel 10a is located in an l-th row (where I is an integer equal to or greater than 1 and different from n and m). Note that the third pixel has a similar circuit configuration as the first pixel 10a. Therefore, in the following description associated with the third pixel, the same reference numerals are used s those used in the description of components of the first pixel 10a.

In FIG. 7, a control signal SEL1<n>, a control signal SEL2<n>, a control signal RST<n>, a control signal SEL1<m>, a control signal SEL2<m>, a control signal RST<m>, a control signal VS1, a control signal VS2, a control signal VS3, a control signal VS4, a control signal VS5, and a control signal VS6 are signals similar to the signals denoted by similar signal names in FIG. 4.

A control signal SEL1<l> is a control signal for controlling the first pixel 10a located in the l-th row in the pixel array 100, and is applied to the gate of the first selection transistor 14a. A control signal SEL2<l> is a control signal for controlling the first pixel 10a, and is applied to the gate of the second selection transistor 15a. A control signal RST<l> is a control signal for controlling the first pixel 10a, and is applied to the gate of the reset transistor 12a.

These control signals are generated by the row scanning circuit 110 and are supplied to pixels located in respective rows via signal lines provided in common for respective rows of the pixel array 100.

In the second operation, as shown in FIG. 7, for a period P11 from time t1 to time t2, as in the first operation, the control signal SEL1<n>, the control signal SEL2<n>, the control signal VS2, and the control signal VS3 are at the HIGH level. As a result, for the period P11, the amplification transistor 13a of the third pixel operates as the source follower circuit that allows a current to flow from one of the second source and the second drain to the other one. Thus, an electric charge accumulated in the FD 16a of the third pixel is output as a signal voltage VSIG to the vertical signal line 53. That is, the electric charge accumulated in FD 16a is read out. In other words, the period P11 is a signal reading period in which the pixel signal is read out.

In the second operation, for a period P12 from time t2 to time t3, the control signal SEL1<n> and the control signal SEL2<n> are at the HIGH level. As a result, the first pixel 10a is connected to the vertical signal line 53, and the first pixel 10a is connected to the feedback signal line 51. For this period P12, the control signal VS1 and the control signal VS4 are at the HIGH level, and thus the switch S1 and the switch S4 are in the conductive state. As a result, the first current source 21 is connected to the feedback signal line 51, and the reference voltage source 33 is connected to the vertical signal line 53. Furthermore, for this period P12, the control signal RST<n> is at the HIGH level. As a result, for the period P12, the amplification transistor 13a of the third pixel operates as the common-source amplifier circuit that allows a current to flow from one of the second source and the second drain to the other one. Therefore, the electric charge accumulated in the third FD 16a is reset by the reference voltage source 33.

In the second operation, as in the first operation, for a period P13 from time t3 and time t4, the control signal SEL1<n>, the control signal VS2, and the control signal VS3 are at the same levels as for the P11. As a result, for the period P13, as for the period P11, the amplification transistor 13a of the first pixel 10a operates as the source follower circuit that allows a current to flow from the one of the second source and the second drain to the other one. Thus, an electric charge accumulated in the FD 16a of the third pixel located in the n-th row of the pixel array 100 is output as a signal voltage VSIG to the vertical signal line 53. That is, the electric charge accumulated in FD 16a is read out.

In the second operation, for a period from time t4 to time t5, the control signal SEL1<n>, the control signal SEL2<n>, the control signal SEL1<m>, the control signal SEL2<m>, the control signal SEL1<l>, and the control signal SEL2<l> are at a LOW level. Thereafter, the control signal SEL1<m>, the control signal SEL2<m>, the control signal SEL1<l>, and the control signal SEL2<l> are at the HIGH levels in for a period P5 from time t5 to time t6. As a result, the first pixel 10a and the second pixel 10b are connected to the vertical signal line 53, the first pixel 10a is connected to the feedback signal line 51, and the second pixel 10b is connected to the feedback signal line 52. For this period P5, the control signal VS1, the control signal VS4, and the control signal VS6 are at the HIGH level, and thus the switch S1, the switch S4, and the switch S6 are in the conductive state. As a result, the first current source 21 is connected to the feedback signal line 51, the second current source 22 is connected to the feedback signal line 52, and the reference voltage source 33 is connected to the vertical signal line 53. Therefore, for this period P5, the amplification transistor 13a of the first pixel 10a operates as the common-source amplifier circuit that allows a current to flow from one of the second source and the second drain to the other one, and the amplification transistor 13b of the second pixel 10b operates as the common-source amplifier circuit that allows a current to flow from one of the fourth source and the fourth drain to the other one. As a result, the electric charge accumulated in the FD 16a of the first pixel 10a is reset by the reference voltage source 33, and the electric charge accumulated in the FD 16b of the second pixel 10b is reset by the reference voltage source 33.

As described above, in the second operation, the imaging device 1 performs, for periods P11 to P13, the reading operation including a sequence of following operations: reading the electric charge accumulated in the FD 16a of the first pixel 10a; resetting the electric charge accumulated in the FD 16a immediately after the reading; and reading the electric charge accumulated in the FD 16a immediately after the resetting. Furthermore, for period P5, the imaging device 1 performs the first shutter operation in which the electric charge accumulated in the FD 16a of the first pixel 10a is reset without being read out, and also perform the second shutter operation in which the electric charge accumulated in the FD 16b of the second pixel 10b is reset without being read out. In this way, the imaging device 1 can simultaneously perform the shutter operation for pixels in two rows.

In a state in which the imaging device is performing a continuous imaging operation, when an exposure period is changed between frames, the shutter operation may be performed at the same time for pixels in two rows. This may occur, for example, in specific cases described below. For example, let it be assumed that the surroundings suddenly become dark in the continuous imaging operation. In such a case, for example, it may be desirable to make the exposure period in a second frame longer than the exposure period in a first frame immediately before the second frame. The exposure period can be adjusted by changing the timing of performing the shutter operation on each pixel. For example, by setting the timing of performing the shutter operation in the second frame earlier than the timing of performing the shutter operation in the first frame, the exposure period in the second frame can be made longer than the exposure period in the first frame. In this situation, there may be a case in which the shutter operation for a row located in a lower region of the pixel array in the first frame and the shutter operation for a row located in an upper region of the pixel array in the second frame are performed at the same time.

Therefore, the imaging device 1 can be used as an imaging device capable of changing the exposure time during continuous imaging.

Note that in the above-described embodiment, reset noise occurring in the FD 16a is reduced by feeding back the output of the common-source amplifier circuit. However, in the configuration shown in FIG. 2, the pixel signal may be output by the common-source amplifier circuit. More specifically, in FIG. 2, the reset transistor 12a of the first pixel 10a may be turned off and the second selection transistor 15a may be turned on thereby outputting the pixel signal to the feedback signal line 51. In this case, the feedback signal line 51 functions as a second vertical signal line for signal reading. In this configuration, the pixel signal can be output to the vertical signal line 53 with a low gain (for example, with a gain smaller than 1), and the pixel signal can be output to the feedback signal line 51 with a high gain (for example, with a gain equal to or greater than 1). By outputting the pixel signal with two gain values in the above-described manner, it is possible to expand the dynamic range.

Figure 17:
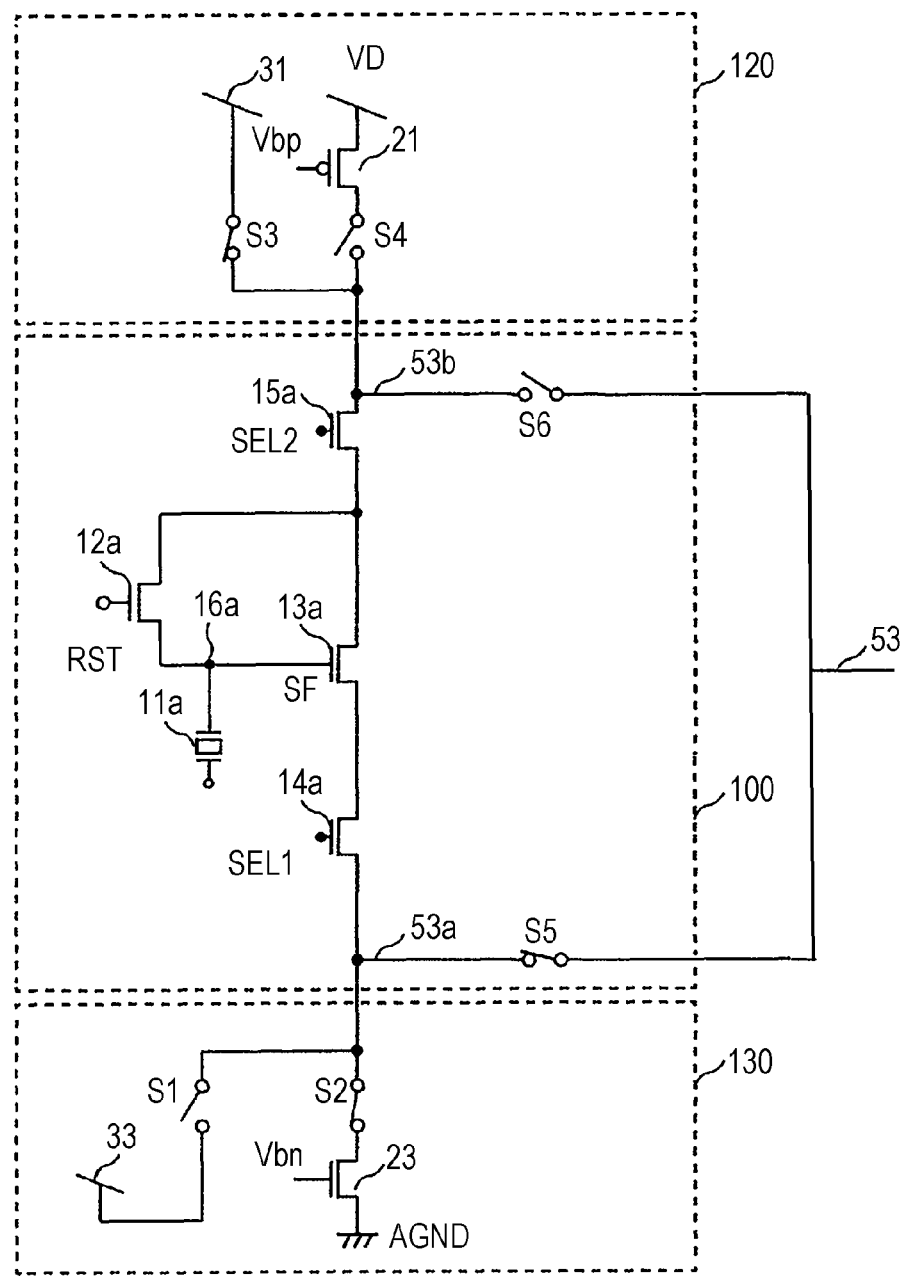
FIG. 17 is a block diagram illustrating main constituent elements of another example of an imaging device according to the first embodiment.

The low gain pixel signal and the high gain pixel signal may be switched in the outputting of the pixel signal to the vertical signal line. A specific example of a circuit configuration is shown in FIG. 17. In FIG. 17, a signal line 53a and a signal line 53b are connected to the vertical signal line 53 via respective switches S5 and S6. To read the pixel signal with a gain smaller than 1 by the source follower operation, the switches S2, S3, and S5, the first selection transistor 14a, and the second selection transistor 15a are turned on. In this state, the amplification transistor 13a and the current source 23 form a source follower. To read the pixel signal with a gain greater than 1 by the common-source amplifier operation, the switches S1, S4, and S6, the first selection transistor 14a, and the second selection transistor 15a are turned on. In this state, the amplification transistor 13a and the current source 21 form an inverting common-source amplifier. The pixel signal read out with the low gain is suitable for a range of illuminance from intermediate illuminance to illuminance at which the pixel is saturated. The pixel signal read out with the high gain is suitable for a range of illuminance from dark to intermediate illuminance. By combining these two pixel signals, it is possible to expand the dynamic range.

Second Embodiment

Figure 8:
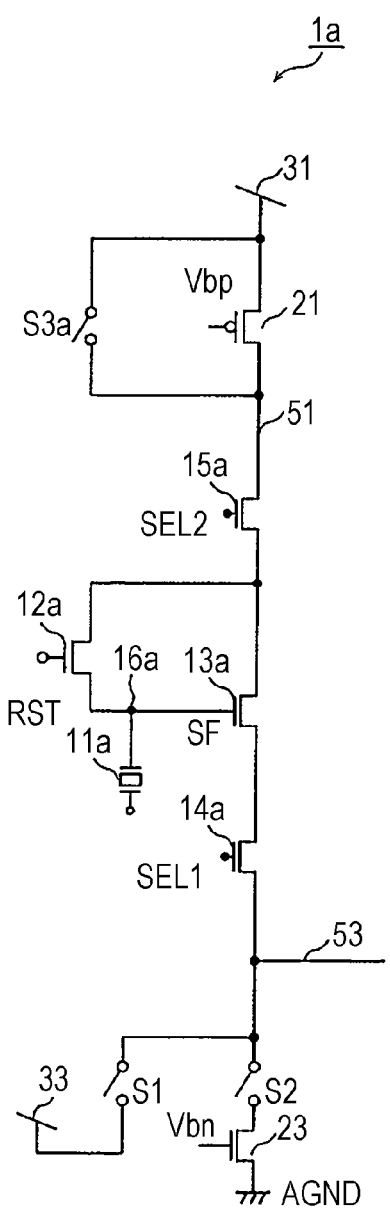
FIG. 8 is a block diagram illustrating main constituent elements of an imaging device according to a second embodiment.

FIG. 8 is a block diagram illustrating main constituent elements of an imaging device 1a according to a second embodiment.

As shown in FIG. 8, the imaging device 1a is different from the imaging device 1 according to the first embodiment in that the switch S4 is not provided, and a switch S3a is provided instead of the switch S3 according to the first embodiment. The switch S3a is connected between the source and the drain of the first current source 21, which is realized using a second-conductivity type transistor. Although not shown in FIG. 8, the imaging device 1a is also different from the imaging device 1 according to the first embodiment in that the switch S6 is not provided and a modified switch is provided instead of the switch S5. The modified switch is connected between the source and the drain of the second current source 22, which is realized using a second-conductivity type transistor. Other than the above, the configuration of the imaging device 1a is the same as that of the imaging device 1 according to the first embodiment.

In the imaging device 1a, when the switch S3a is turned on into the conductive state, the first power supply 31 is connected to the feedback signal line 51. As a result, a potential difference between the source and the drain of the first current source 21 disappears. In this state, the first current source 21 does not flow any current. When the switch S3a turns into a non-conductive state, the first current source 21 starts to provide a flow of a current, and the current flows from the first current source 21 to the feedback signal line 51. As described above, the switch S3a serves both the role as the switch S3 and the role of the switch S4 in the imaging device 1 according to the first embodiment.

Similarly, the modified switch serves both the role as the switch S5 and the role of the switch S6 in the imaging device 1 according to the first embodiment.

As described above, the imaging device 1a can operate in a similar manner to the imaging device 1 according to the first embodiment.

Figure 9:
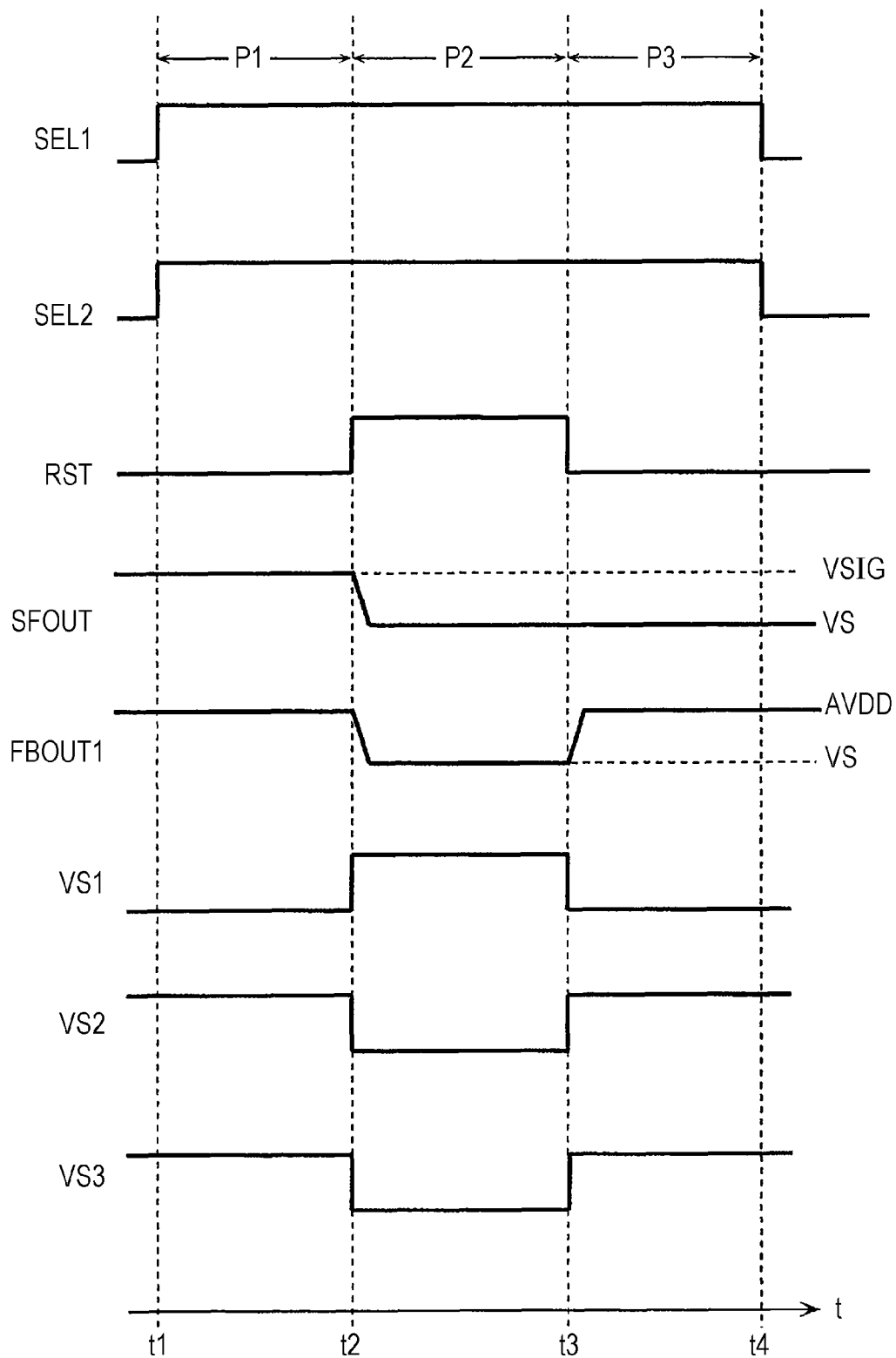
FIG. 9 is a timing chart of an operation of the imaging device according to the second embodiment.

FIG. 9 is a timing chart associated with various signals in the imaging device 1a.

As shown in FIG. 9, each signal in the imaging device 1a changes in the same manner as each corresponding signal in the imaging device 1 according to the first embodiment.

The imaging device 1a configured in the above-described manner can perform the same operation as the imaging device 1 according to the first embodiment although the imaging device 1a includes a smaller number of constituent elements than the imaging device 1 according to the first embodiment includes. Thus, the imaging device 1a can be smaller in size than the imaging device 1 according to the first embodiment.

Third Embodiment

Figure 10:
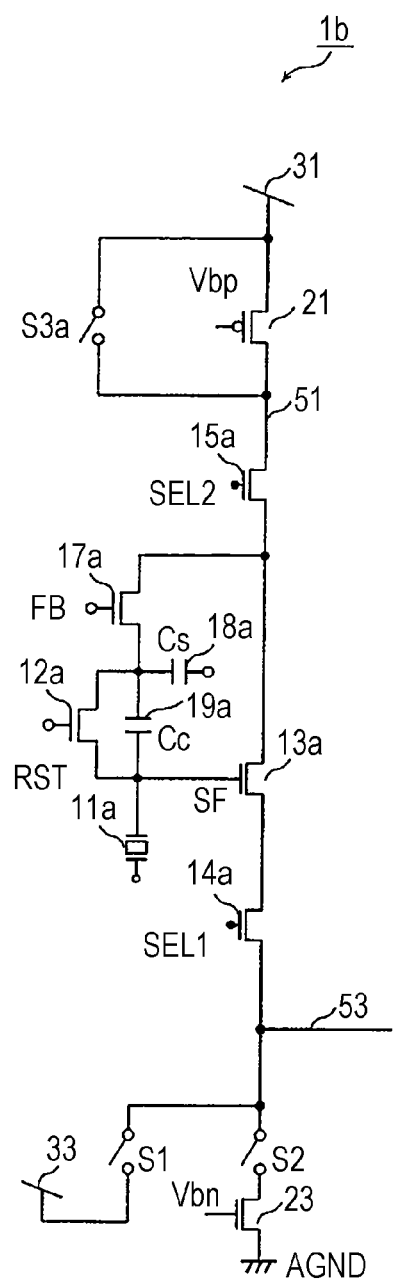
FIG. 10 is a block diagram illustrating main constituent elements of an imaging device according to a third embodiment.

FIG. 10 is a block diagram illustrating main constituent elements of an imaging device 1b according to a third embodiment.

As shown in FIG. 10, the imaging device 1b is different from the imaging device 1a according to the second embodiment in that a fourth transistor 17a, a first capacitor 18a, and a first capacitor 19a are provided in the first pixel 10a. Although not shown in FIG. 10, the imaging device 1b is also different from the imaging device 1a according to the second embodiment in that a fourth transistor, a second capacitor 18b, and a second capacitor 19b are provided in the second pixel 10b. Other than the above, the configuration of the imaging device 1b is the same as that of the imaging device 1a according to the second embodiment.

The fourth transistor 17a of the first pixel 10a is a first-conductivity type transistor, and is electrically connected between the other one of the first source and the first drain of the reset transistor 12a and one of the second source and the second drain of the amplification transistor 13a.

The fourth transistor of the second pixel 10b is a first-conductivity type transistor, and is electrically connected between the other one of the third source and the third drain of the reset transistor 12b and one of the fourth source and the fourth drain of the amplification transistor 13b.

The first capacitor 18a has two terminals, one of which is connected to the other one of the first source and the first drain of the reset transistor 12a. The other terminal of the first capacitor 18a is supplied with a fixed voltage.

The first capacitor 19a is a capacitor between the other one of the first source and the first drain of the reset transistor 12a and one of the first source and the first drain of the reset transistor 12a.

The second capacitor 18b has two terminals, one of which is connected to the other one of the third source and the third drain of the reset transistor 12b. The other terminal of the second capacitor 18b is supplied with a fixed voltage.

The second capacitor 19b is connected between the other one of the third source and the third drain of the reset transistor 12b and one of the third source and the third drain of the reset transistor 12b.

In FIG. 10, the amplification transistor 13a may be connected to the vertical signal line 53 without providing SEL1.

Figure 11:
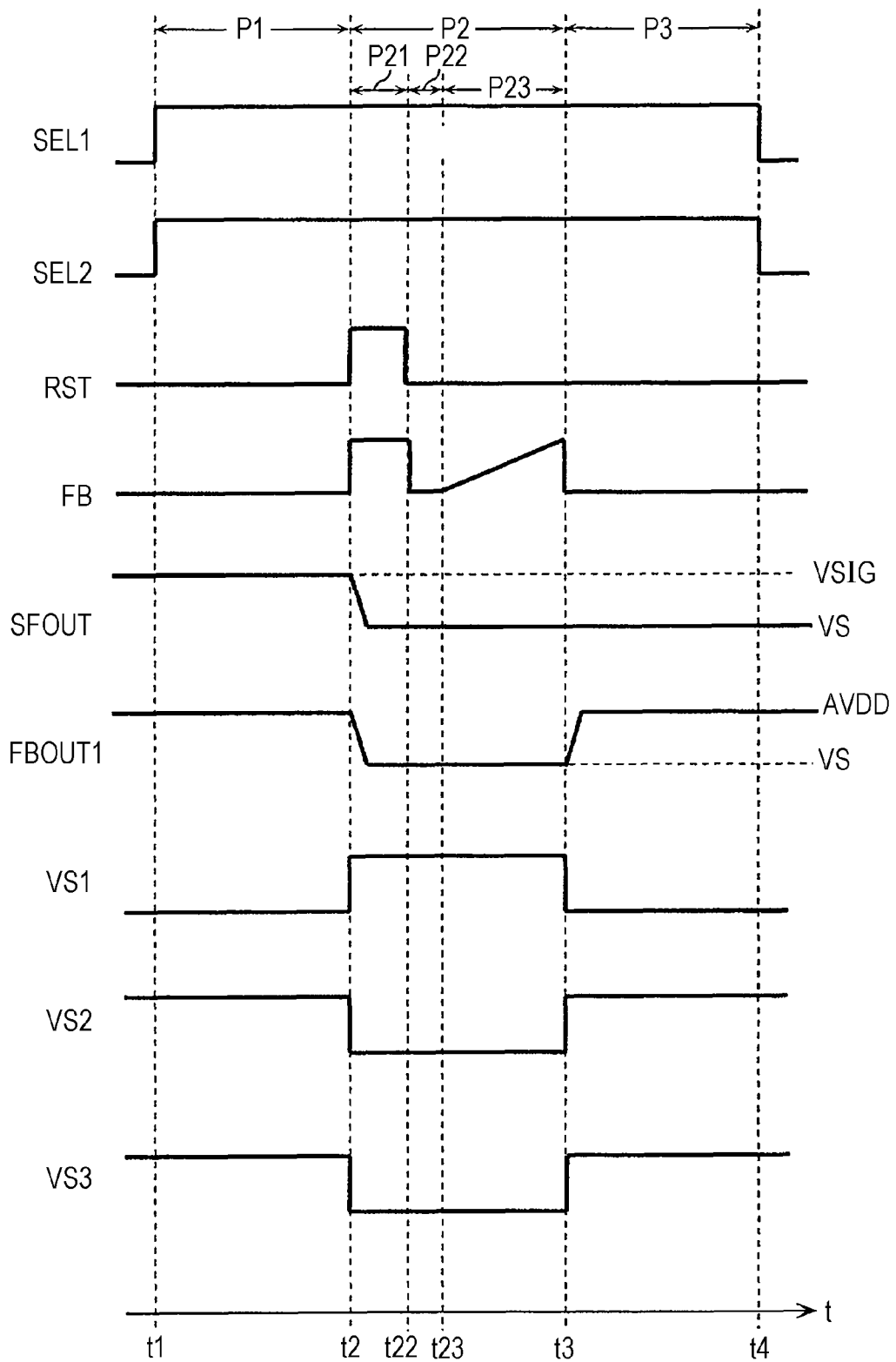
FIG. 11 is a timing chart of an operation of the imaging device according to the third embodiment.

FIG. 11 is a timing chart associated with various signals in the imaging device 1b.

As shown in FIG. 11, each signal in the imaging device 1a changes in the same manner as each corresponding signal in the imaging device 1 according to the first embodiment except for a control signal RST which is input to the first gate of the reset transistor 12a and the third gate of the reset transistor 12b, and a control signal FB which is input to the gate of the fourth transistor 17a of the first pixel 10a and the gate of the fourth transistor of the second pixel 10b.

In a period P2 from time t2 to t3, the control signal RST is at the HIGH level for a period P21 from time t2 to time t22 and in the following period P22 from time t22 to time t3 and a further following period P23, the control signal RST is at the LOW level.

In the period P2, the control signal FB is at the HIGH level for the period P21, then for the following period P22 from time t22 to time t23, the control signal FB is at the LOW level. Thereafter, in the further following period P23 from time t23 to time t3, the signal level of the control signal FB linearly increases from the LOW level to the HIGH level.

The imaging device 1b configured in the above-described manner operates in the period P2 such that the bandwidth of the feedback loop formed in the pixel 10 is limited, the first capacitor 18a and the first capacitor 19a perform capacitance dividing, and the second capacitor 18b and the second capacitor 18b perform capacitance dividing, thereby effectively suppressing the reset noise in the pixel 10.

Fourth Embodiment

Figure 12:
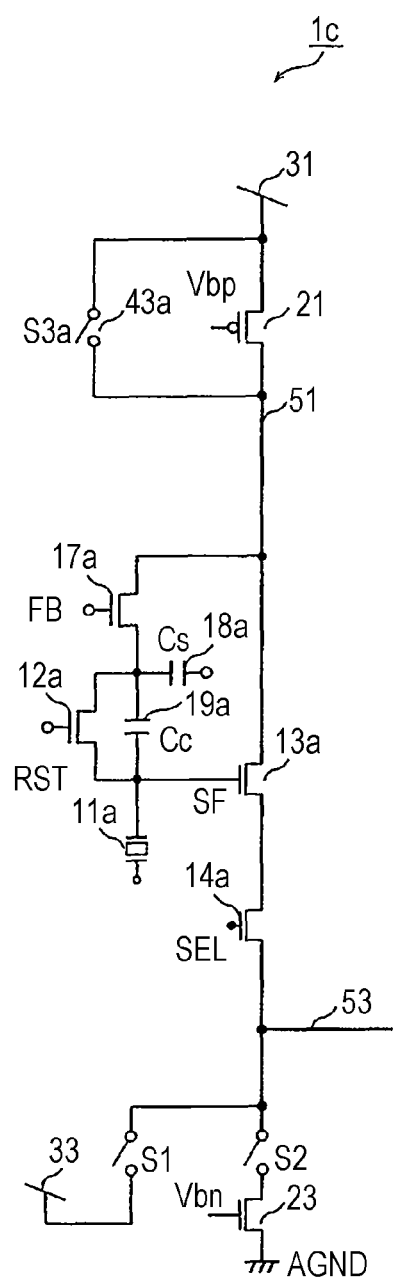
FIG. 12 is a block diagram illustrating main constituent elements of an imaging device according to a fourth embodiment.

FIG. 12 is a block diagram illustrating main constituent elements of an imaging device 1ace according to a fourth embodiment.

As shown in FIG. 12, the imaging device 1c is different from the imaging device 1b according to the third embodiment in that the imaging device 1c does not include the second selection transistor 15a. Although not shown in FIG. 12, the imaging device 1c is further different from the imaging device 1b according to the third embodiment in that the imaging device 1c does not include the second selection transistor 15b. Other than the above, the configuration of the imaging device 1c is the same as that of the imaging device 1b according to the third embodiment.

In the imaging device 1c, using the first selection transistor 14a without using the second selection transistor 15a, it is possible to select a first pixel 10a whose amplification transistor 13a is to be operated as the amplifier among from the first pixels 10a connected to the feedback signal line 51.

Furthermore, in the imaging device 1c, using the first selection transistor 14a without using the second selection transistor 15a, it is possible to select a first pixel 10a whose amplification transistor 13a is to be operated as the source follower among from the first pixels 10a connected to the feedback signal line 51.

As described above, the first selection transistor 14a can also serve the role of the second selection transistor 15a.

Similarly, the first selection transistor 14b can also serve the role of the second selection transistor 15b.

As described above, the imaging device 1c can perform similar operations to the operations performed by the imaging device 1b according to the third embodiment.

In the fourth embodiment, instead of the configuration described above, the imaging device may be configured such that the first selection transistor 14a is not provided, but, instead, the second selection transistor 15a according to the third embodiment is provided. In the fourth embodiment, even when the imaging device is configured not to include the first selection transistor 14a, it is possible to perform similar operations to the operations performed by the imaging device 1b according to the third embodiment.

Figure 13:
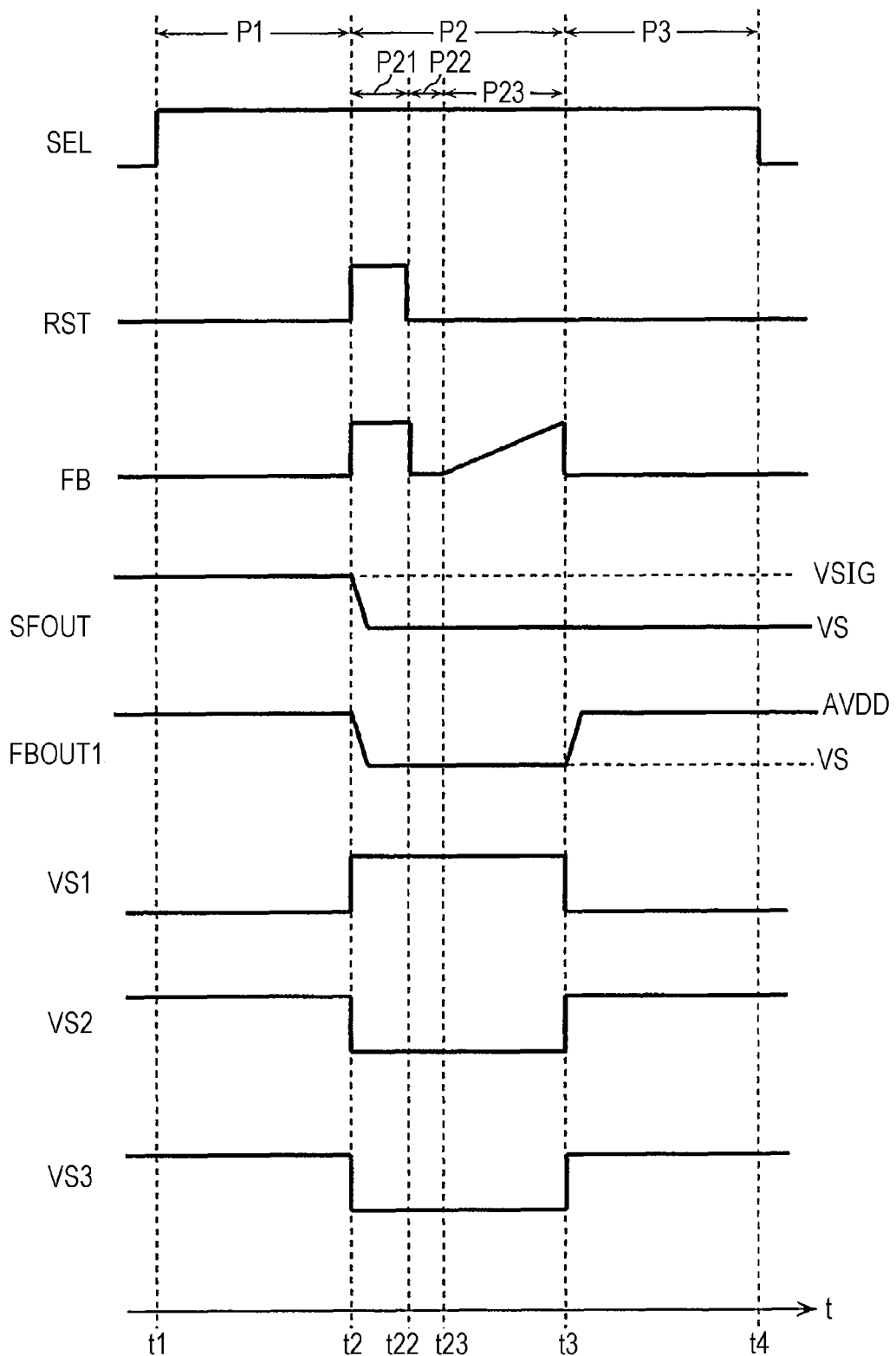
FIG. 13 is a timing chart of an operation of the imaging device according to the fourth embodiment.

FIG. 13 is a timing chart associated with various signals in the imaging device 1c.

As shown in FIG. 13, each signal in the imaging device 1c changes in the same manner as each corresponding signal in the imaging device 1b according to the third embodiment.

The imaging device 1c configured in the above-described manner can perform similar operations to the operations which can be performed by the imaging device 1b according to the third embodiment with a smaller number of elements than the imaging device 1b of embodiment 3. Thus, according to the imaging device 1c, the size of the imaging device 1c can be smaller than the size of the imaging device 1b according to the third embodiment.

Fifth Embodiment

Figure 14:
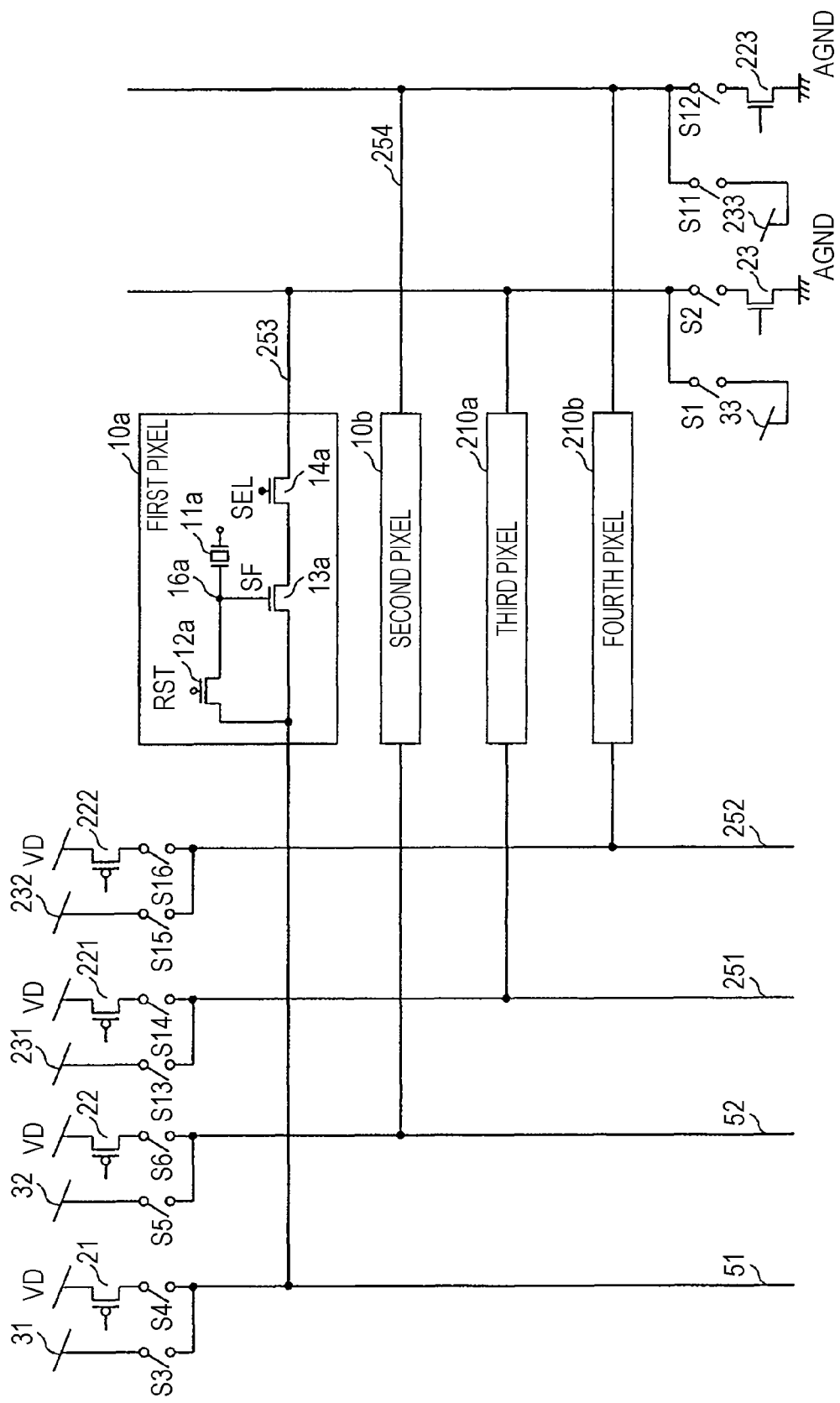
FIG. 14 is a block diagram illustrating main constituent elements of an imaging device according to a fifth embodiment.

FIG. 14 is a block diagram illustrating a main circuit constituent elements of an imaging device 1d according to a fifth embodiment.

In addition to the set of the first pixel 10a and the second pixel 10b in the imaging device 1 according to the first embodiment, the imaging device 1d further includes another similar set of a third pixel 210a (described later) and a fourth pixel 210b (described later). More specifically, as shown in FIG. 14, in addition to the elements of the imaging device 1 according to the first embodiment, the imaging device 1d further includes the third pixel 210a, the fourth pixel 210b, a fourth current source 221, a fifth current source 222, a sixth current source 223, a third power supply 231, a fourth power supply 232, a reference voltage source 233, a switch S11, a switch S12, a switch S13, a switch S14, a switch S15, a switch S16, a feedback signal line 251, a feedback signal line 252, and a vertical signal line 254. Instead of the vertical signal line 53 in the first embodiment, the imaging device 1d includes a vertical signal line 253. In the imaging device 1d, unlike the imaging device 1 according to the first embodiment in which the second pixel 10b is connected to the vertical signal line 53, the second pixel 10b is connected to the vertical signal line 254.

The third pixel 210a is similar to the first pixel 10a and is located in the same column as the column in which the first pixel 10a is located. Therefore, in the following description associated with constituent elements of the third pixel 210a, the same reference numerals are used as those used in the description of elements of the first pixel 10a.

The fourth pixel 210b is similar to the second pixel 10b and is located in the same column as the column in which the second pixel 10b is located. Therefore, in the following description of constituent elements of the fourth pixel 210b, the same reference numerals are used as those used in the description of the elements of the second pixel 10b.

As described in the first embodiment, the first pixel 10a and the second pixel 10b are similar to each other. That is, the first pixel 10a, the second pixel 10b, the third pixel 210a, and the fourth pixel 210b are similar to each other. Therefore, when it is not necessary to explicitly distinguish among the first pixel 10a, the second pixel 10b, the third pixel 210a, and the fourth pixel 210b, the first pixel 10a, the second pixel 10b, the third pixel 210a, and the fourth pixel 210b may be generically referred to as a pixel 10.

The fourth current source 221 and the first current source 21 are similar to each other. The fifth current source 222 and the second current source 22 are similar to each other. The sixth current source 223 and the third current source 23 are similar to each other. The third power supply 231 and the first power supply 31 are similar to each other. The fourth power supply 232 and the second power supply 32 are similar to each other. The reference voltage source 233 and the reference voltage source 33 are similar to each other. The switch S11 and the switch S1 are similar to each other. The switch S12 and the switch S2 are similar to each other. The switch S13 and the switch S3 are similar to each other. The switch S14 and the switch S4 are similar to each other. The switch S15 and the switch S5 are similar to each other. The switch S16 and the switch S6 are similar to each other.

The feedback signal line 251 extends in the column direction in the pixel array, and is connected to the switch S13, the switch S14, and the second selection transistor 15a of the third pixel 210a.

The feedback signal line 252 extends in the column direction in the pixel array, and is connected to the switch S15, the switch S16, and the second selection transistor 15b of the fourth pixel 210b.

The vertical signal line 253 extends in the column direction in the pixel array, and is connected to the switch S1, the switch S2, the first selection transistor 14a of the first pixel 10a, and the first selection transistor 14a of the of the third pixel 210a.

The vertical signal line 254 extends in the column direction in the pixel array, and is connected to the switch S11, the switch S12, the first selection transistor 14b of the second pixel 10b, and the first selection transistor 14b of the fourth pixel 210b.

The vertical signal line 253 and the third current source 23 function as part of a reading circuit that performs a reading operation on a pixel 10 connected to the vertical signal line 253 and the third current source 23, and the vertical signal line 254 and the sixth current source 223 function as part of a reading circuit that performs a reading operation on a pixel 10 connected to the vertical signal line 254 and the sixth current source 223.

Figure 15:
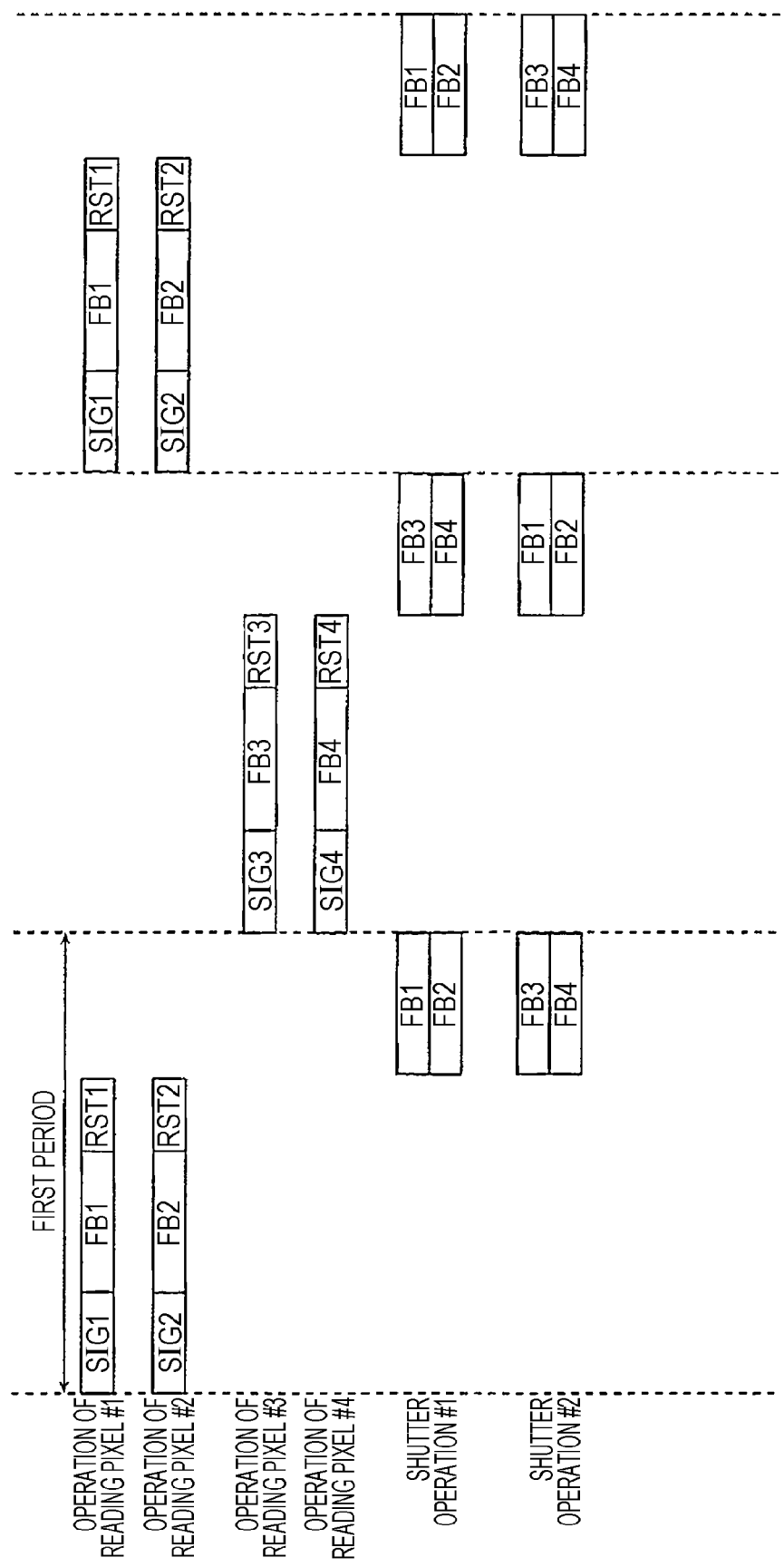
FIG. 15 is a timing chart of an operation of the imaging device according to the fifth embodiment.

FIG. 15 is a timing chart associated with various signals in the imaging device 1d.

In FIG. 15, a period SIG1, a period SIG2, a period SIG3, and a period SIG4 each correspond to the period P1 in the first embodiment. A period FB1, a period FB2, a period FB3, and a period FB4 each correspond to the period P2 or the period P12 in the first embodiment. A period RST1, a period RST2, a period RST3, and a period RST4 each correspond to the period P3 in the first embodiment.

As shown in FIG. 15, in a first one cycle, the imaging device 1d first simultaneously performs the reading operation on the first pixel 10a and the reading operation on the second pixel 10b. Next, the shutter operation for an arbitrary first pixel 10a connected to the feedback signal line 51 and an arbitrary second pixel 10b connected to the feedback signal line 52, and the shutter operation for an arbitrary third pixel 210a connected to the feedback signal line 251 and an arbitrary fourth pixel 210b connected to the feedback signal line 252 are simultaneously performed.

Furthermore, in a next one cycle, first, the imaging device 1d simultaneously performs the reading operation on the third pixel 210a and the reading operation on the fourth pixel 210b. Next, the shutter operation for an arbitrary third pixel 210a connected to the feedback signal line 251 and an arbitrary fourth pixel 10b connected to the feedback signal line 252, and the shutter operation for an arbitrary first pixel 10a connected to the feedback signal line 51 and an arbitrary second pixel 10b connected to the feedback signal line 52 are simultaneously performed.

Thereafter, the imaging device 1d alternately performs the operation in the first one cycle and the operation in the next one cycle, repeatedly.

As described above, the imaging device 1d can simultaneously perform the reading operation on two pixels 10 in different rows in one cycle.

This makes it possible for the imaging device 1d to achieve a high frame rate in continuous imaging.

NOTES

As described above, the techniques according to the present disclosure have been described above with reference to specific embodiments including the first to fifth embodiments. However, the techniques according to the present disclosure are not limited thereto, modifications, replacements, additions, omissions, and the like are possible without departing from the spirit of the present disclosure.

Some examples of modifications in the present disclosure are described below.

(1) According to a first modification, the imaging device may include a third bias circuit having a similar configuration to that of the first bias circuit 120 in the imaging device 1 according to the first embodiment. The third bias circuit is connected to the feedback signal line 51 and the feedback signal line 52. The third bias circuit is disposed below the pixel array 100.

In the imaging device according to the first modification, currents are supplied to the feedback signal line 51 from both the first bias circuit 120 and the third bias circuit. Furthermore, currents are supplied to the feedback signal line 52 from both the first bias circuit 120 and the third bias circuit. That is, currents are supplied to the feedback signal line 51 from both above and below the pixel array 100. Therefore, the voltage drop occurring along the feedback signal line described above with reference to FIG. 6 can be reduced.

(2) According to a second modification, the imaging device may include a fourth bias circuit having a similar configuration to that of the second bias circuit 130 in the imaging device 1 according to the first embodiment. The fourth bias circuit is connected to the vertical signal line 53. The fourth bias circuit is disposed above the pixel array 100.

In the imaging device according to the second modification, a current flowing into the vertical signal line 53 is drawn into both the second bias circuit 130 and the fourth bias circuit. Thus, the current flowing into the vertical signal line 53 is drawn above and below the pixel array 100. Therefore, the voltage drop occurring along the vertical signal line 53 can be reduced.

The imaging device according to the second modification to the imaging device 1 according to the first embodiment may include both the third bias circuit and the fourth bias circuit.

(3) According to a third modification, the imaging device includes k (k is an integer equal to or greater than 3) reading circuits connected to pixels 10 in different rows thereby making it possible to perform reading operations on the k pixels 10 in different rows in one cycle. In this configuration, if N_READ_PIXEL denotes the number of pixels that can be read out in one cycle, N_SFOUT denotes the number of vertical signal lines functioning as signal lines that drawing currents from pixels subjected to the reading operation (that is, the number of reading circuits), and N_FBOUT denotes the number of feedback signal lines functioning as signal lines for supplying currents to pixels to be subjected to reading operations, then relationships among N_READ_PIXEL, N_SFOUT, and N_FBOUT are represented by following equations (1) and (2), $$N\_SFOUT = N\_FBOUT/2 \tag{1}$$

$$N\_READ\_PIXEL = N\_SFOUT \tag{2}$$

(4) The conductivity types of the transistors described in the first to fifth embodiments are merely examples. In the first to fifth embodiment, the amplification transistor 13a, the amplification transistor 13b, and the transistor in the third current source 23 are to have the same conductivity type, and the amplification transistor 13a, the amplification transistor 13b, and the transistor in the first current source 21, the transistor in the second current source 22 are to have the same conductivity type. However, there is not specific restriction on the conductivity types of the other transistors. For example, the conductivity types of the transistors in the one pixel 10 are not necessarily all the same.

The imaging device according to the present disclosure is applicable widely to apparatuses that capture images.

What is claimed is:
1. An imaging device comprising:
pixels that are arranged in an array and that include first pixels and second pixels located in a same column of the array of the pixels, each of the first pixels and each of the second pixels including
a photoelectric converter that converts incident light to an electric charge,
a first transistor, one of a source or a drain of which is electrically connected to the photoelectric converter, and
a second transistor, a gate of which is electrically connected to the photoelectric converter, one of a source or a drain of the second transistor being electrically connected to the other one of the source or the drain of the first transistor;
a first current source configured to be electrically connected to one of the source or the drain of the second transistor of each of the first pixels;
a second current source configured to be electrically connected to one of the source or the drain of the second transistor of each of the second pixels;
a signal line configured to be electrically connected to the other one of the source or the drain of the first pixels and to the other one of the source or the drain of the second transistor of each of the second pixels, and a third current source configured to be electrically connected to the signal line.

2. The imaging device according to claim 1, further comprising
a first power supply configured to be electrically connected to the one of the source or the drain of the second transistor of each of the first pixels, and
a second power supply configured to be electrically connected to the one of the source or the drain of the second transistor of each of the second pixels.

3. The imaging device according to claim 2, further comprising
a first switching circuit that selectively connects one of the first current source or the first power supply electrically to the one of the source or the drain of the second transistor of each of the first pixels, and
a second switching circuit that selectively connects one of the second current source or the second power supply electrically to the one of the source or the drain of the second transistor of each of the second pixels.

4. The imaging device according to claim 1, further comprising
a reference voltage source configured to be electrically connected to the signal line.

5. The imaging device according to claim 4, further comprising
a third switching circuit that selectively connects one of the third current source or the reference voltage source electrically to the signal line.

6. The imaging device according to claim 1, wherein
the first current source includes a first current source transistor,
the second current source includes a second current source transistor,
the third current source includes a third current source transistor,
the second transistor and the third current source transistor are each of a first conductivity type, and
the first current source transistor and the second current source transistor are each of a second conductivity type different from the first conductivity type.

7. The imaging device according to claim 1, wherein
the first current source includes a first current source transistor and a first switch electrically connected between a source and a drain of the first current source transistor, and
the second current source includes a second current source transistor and a second switch electrically connected between a source and a drain of the second current source transistor.

8. The imaging device according to claim 1, wherein
the first pixels and the second pixels each further include a third transistor electrically connected between the signal line and the other one of the source or the drain of the second transistor.

9. The imaging device according to claim 1, wherein
the first pixels and the second pixels each further include a fourth transistor electrically connected between the other one of the source or the drain of the first transistor and the one of the source or the drain of the second transistor being electrically connected to the other one of the source or the drain of the first transistor.

10. The imaging device according to claim 1, wherein
the first pixels and the second pixels each output a signal corresponding to an amount of the electric charge to the signal line.

11. The imaging device according to claim 1, wherein
the first pixels and the second pixels are located in a first region in which the pixels are arranged, and
the first current source and the second current source are located in a second region which surrounds, in plan view, the first region.

12. The imaging device according to claim 1, wherein
the first pixels and the second pixels are located on a first substrate, and
the first current source and the second current source are located on a second substrate different from the first substrate.

13. The imaging device according to claim 1, wherein the first pixels and the second pixels are alternately arranged in the column direction.

14. The imaging device according to claim 1, further comprising
a first line extending in a column direction, the first current source being configured to be electrically connected to the one of the source or the drain of the second transistor of each of the first pixels via the first line, and
a second line extending in the column direction, the second current source being configured to be electrically connected to the one of the source or the drain of the second transistor of each of the second pixels via the second line.

15. The imaging device according to claim 1, wherein
the first current source is configured to be electrically connected to the one of the source or the drain of the second transistor of each of the first pixels not through the second transistor of corresponding one of the first pixels;
the second current source is configured to be electrically connected to the one of the source or the drain of the second transistor of each of the second pixels not through the second transistor of corresponding one of the first pixels;
the signal line is configured to be electrically connected to the other one of the source and the drain of the second transistor of each of the first pixels and to the other one of the source or the drain of the second transistor of each of the second pixels not through the second transistor of corresponding one of the second pixels; and
the third current source is configured to be electrically connected to the one of the source or the drain of the second transistor of each of the first pixels and to the one of the source or the drain of the second transistor of each of the second pixels via the signal line.

16. The imaging device according to claim 1, wherein the third current source is different from the first current source and the second current source.

17. An imaging device comprising:
pixels that are arranged in an array and that include first pixels and second pixels located in a same column of the array of the pixels, each of the first pixels and each of the second pixels including
a photoelectric converter that converts incident light to an electric charge,
a first transistor, one of a source and a drain of which is electrically connected to the photoelectric converter, and
a second transistor, a gate of which is electrically connected to the photoelectric converter, and one of a source and a drain of which is electrically connected to the other one of the source or drain of the first transistor;

a first current source configured to be electrically connected to one of the source or the drain of the second transistor of each of the first pixels;
a second current source configured to be electrically connected to one of the source or the drain of the second transistor of each of the second pixels;
a signal line configured to be electrically connected to the other one of the source or the drain of the second transistor of each of the first pixels and to the other one of the source or the drain of the second transistor of each of the second pixels; and
a third current source configured to be electrically connected to the signal line, wherein:
the first current source includes a first current source transistor,
the second current source includes a second current source transistor,
the third current source includes a third current source transistor,
the second transistor and the third current source transistor are each of a first conductivity type, and
the first current source transistor and the second current source transistor are each of a second conductivity type different from the first conductivity type.

18. An imaging device comprising:
pixels that are arranged in an array and that include first pixels and second pixels located in a same column of the array of the pixels, each of the first pixels and each of the second pixels including
a photoelectric converter that converts incident light to an electric charge,
a first transistor, one of a source and a drain of which is electrically connected to the photoelectric converter, and
a second transistor, a gate of which is electrically connected to the photoelectric converter, and one of a source and a drain of which is electrically connected to the other one of the source or drain of the first transistor;
a first current source configured to be electrically connected to one of the source or the drain of the second transistor of each of the first pixels;
a second current source configured to be electrically connected to one of the source or the drain of the second transistor of each of the second pixels; and
a signal line configured to be electrically connected to the other one of the source or the drain of the second transistor of each of the first pixels and to the other one of the source or the drain of the second transistor of each of the second pixels, wherein:
the first current source includes a first current source transistor and a first switch electrically connected between a source and a drain of the first current source transistor, and
the second current source includes a second current source transistor and a second switch electrically connected between a source and a drain of the second current source transistor.

* * * * *